United States Patent
Kitamura et al.

(10) Patent No.: US 8,565,344 B2
(45) Date of Patent: Oct. 22, 2013

(54) TRANSMISSION CIRCUIT AND COMMUNICATION DEVICE

(75) Inventors: Ryo Kitamura, Kanagawa (JP); Takahito Miyazaki, Kyoto (JP)

(73) Assignee: Panasonic Corporation, Osaka (JP)

( * ) Notice: Subject to any disclaimer, the term of this patent is extended or adjusted under 35 U.S.C. 154(b) by 100 days.

(21) Appl. No.: 13/380,955

(22) PCT Filed: Apr. 1, 2010

(86) PCT No.: PCT/JP2010/002408
§ 371 (c)(1),
(2), (4) Date: Dec. 27, 2011

(87) PCT Pub. No.: WO2011/001575
PCT Pub. Date: Jan. 6, 2011

(65) Prior Publication Data
US 2012/0099675 A1    Apr. 26, 2012

(30) Foreign Application Priority Data
Jul. 2, 2009   (JP) .................................. 2009-158097

(51) Int. Cl.
*H04L 27/36*   (2006.01)

(52) U.S. Cl.
USPC ........... 375/298; 375/295; 375/296; 375/261; 375/300; 375/316

(58) Field of Classification Search
USPC .......... 375/296, 298, 300, 261, 316; 370/206; 455/60
See application file for complete search history.

(56) References Cited

U.S. PATENT DOCUMENTS 5,903,854 A    5/1999   Abe et al.
8,369,801 B2 *  2/2013   Shimizu et al. .................. 455/91
(Continued)

FOREIGN PATENT DOCUMENTS

JP   5-110348    4/1993
JP   2003-324323   11/2003
(Continued)

OTHER PUBLICATIONS

International Search Report issued May 11, 2010 in corresponding International Application No. PCT/JP2010/002408.

(Continued)

*Primary Examiner* — Dhaval Patel
(74) *Attorney, Agent, or Firm* — Wenderoth, Lind & Ponack, L.L.P.

(57) ABSTRACT

Provided is a transmission circuit which allows smooth switching of the operation mode when switching the operation mode of the transmission circuit. A power amplifier 14 includes: a first input terminal to which a direct-current voltage or a voltage in accordance with an amplitude signal M is supplied; a second input terminal to which an output signal from a first variable gain amplifier 171 or an output signal from a second variable gain amplifier 172 is inputted; and a third input terminal to which an output signal from a first bias circuit 15 or an output signal from a second bias circuit 16 is inputted. A control section 11 switches the operation mode of the transmission circuit so that at least one of the first input terminal, the second input terminal, and the third input terminal of the power amplifier is prevented from being in a no input state.

26 Claims, 25 Drawing Sheets

(56) References Cited

U.S. PATENT DOCUMENTS

| | | |
|---|---|---|
| 2004/0071225 A1 | 4/2004 | Suzuki et al. |
| 2004/0185803 A1 | 9/2004 | Tanabe et al. |
| 2005/0245224 A1 | 11/2005 | Kurioka |
| 2009/0079511 A1 | 3/2009 | Matsuura et al. |

FOREIGN PATENT DOCUMENTS

| | | |
|---|---|---|
| JP | 2004-104194 | 4/2004 |
| JP | 2004-289812 | 10/2004 |
| JP | 2005-269181 | 9/2005 |
| JP | 2008-172544 | 7/2008 |
| JP | 2008-539601 | 11/2008 |

OTHER PUBLICATIONS

F. H. Raab et al., "High-Efficiency L-Band Kahn-Technique Transmitter", IEEE MTT-S Int. Microwave Symp. Dig., Jun. 1998, pp. 585-588.

* cited by examiner

FIG. 4

| POWER INFORMATION P | OPERATION MODE |
|---|---|
| P1 | QUADRATURE MODULATION SCHEME |
| P2 | QUADRATURE MODULATION SCHEME |
| P3 | POLAR MODULATION SCHEME |
| P4 | POLAR MODULATION SCHEME |
| P5 | POLAR MODULATION SCHEME |
| ⋮ | ⋮ |

F I G. 6 B
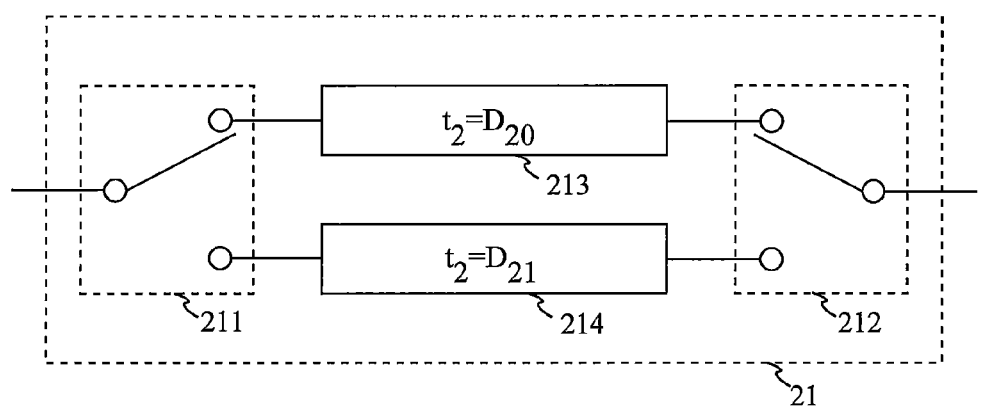

F I G. 9 A
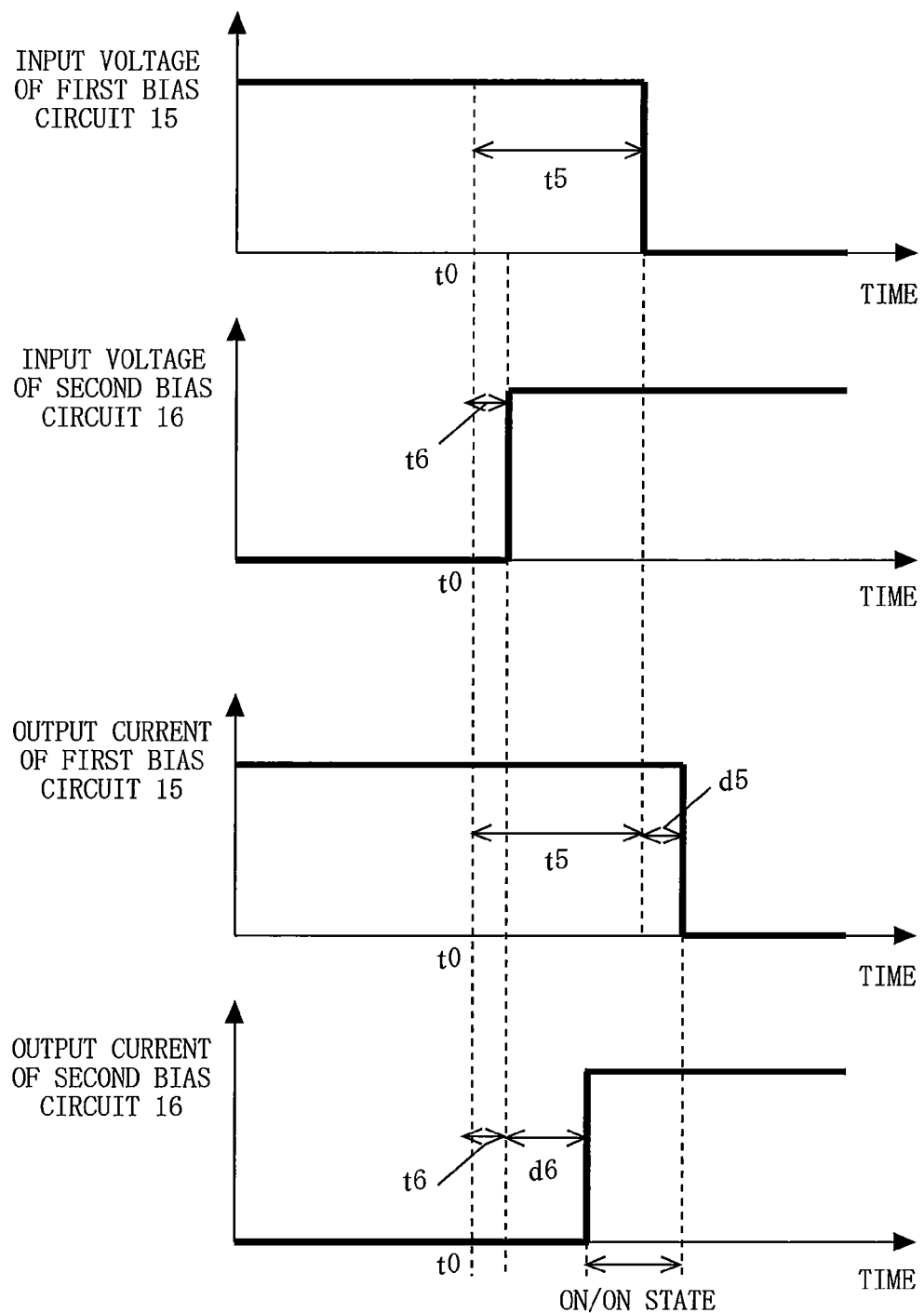

TRANSMISSION CIRCUIT AND COMMUNICATION DEVICE

TECHNICAL FIELD

The present invention relates to a transmission circuit for use in communication devices such as mobile phones, wireless LAN devices, and the like, and more particularly, a transmission circuit which operates at high precision and high efficiency, and a communication device using the same.

BACKGROUND ART

In the advanced information society in recent years, communication devices such as mobile phones, wireless LAN devices, and the like are required to ensure the linearity of a transmission signal over a wide range of power amplification and also operate with low power consumption. In such a communication device, a transmission circuit which outputs a high-precision transmission signal regardless of the bandwidth and operates at high efficiency is employed. A conventional transmission circuit will be described below.

Examples of the conventional transmission circuit include transmission circuits (hereinafter, referred to as a quadrature modulation circuit) which use modulation schemes such as quadrature modulation or the like to generate transmission signals. The quadrature modulation circuit has been widely known, thus the description thereof is omitted. Also, an example of a conventional transmission circuit which operates at higher efficiency than a quadrature modulation circuit is a transmission circuit 500 shown in FIG. 18 (for example, see Non-Patent Literature 1). FIG. 18 is a block diagram showing an example of a configuration of the conventional transmission circuit 500 disclosed in Non-Patent Literature 1. In FIG. 18, the conventional transmission circuit 500 includes a signal generation section 501, a phase modulation section 502, a regulator 503, a power amplifier (PA) 504, and a power supply terminal 505. The power amplifier 504 includes an amplifying transistor.

In the conventional transmission circuit 500, the signal generation section 501 generates an amplitude signal and a phase signal. The amplitude signal is inputted to the regulator 503. The regulator 503 is supplied with a direct-current voltage by the power supply terminal 505. The regulator 503 supplies a voltage in accordance with an inputted amplitude signal to the power amplifier 504. It should be noted that, typically, the regulator 503 supplies a voltage in proportion to the magnitude of the inputted amplitude signal to the power amplifier 504.

On the other hand, the phase signal is inputted to the phase modulation section 502. The phase modulation section 502 phase-modulates the phase signal and outputs a phase-modulated signal. The phase-modulated signal is inputted to the power amplifier 504. The power amplifier 504 amplitude-modulates the phase-modulated signal using the voltage supplied by the regulator 503, and outputs the resultant signal as a modulation signal that is phase-modulated and amplitude-modulated. The modulation signal is outputted as a transmission signal from an output terminal. It should be noted that such the transmission circuit 500 is referred to as a polar modulation circuit.

However, the conventional quadrature modulation circuit has a characteristic that, when the output power is low, the linearity is high but the power efficiency is poor. In addition, the conventional polar modulation circuit has a characteristic that the polar modulation circuit operates at high precision and high efficiency when the magnitude of the output power is greater than a certain magnitude, whereas, when the output power is low, the linearity deteriorates and the power efficiency declines. This is because, when the output power is low, it is difficult to linearly control the power amplifier 504 and also the power amplifier 504 operates outside the saturation region.

Therefore, a transmission circuit which switches the operation mode in accordance with an output power is previously disclosed (for example, see Patent Literature 1). FIG. 19 is a block diagram showing an example of a configuration of a conventional transmission circuit 600 disclosed in Patent Literature 1. In FIG. 19, the conventional transmission circuit 600 uses the quadrature modulation scheme when the output power is low, and uses the polar modulation scheme when the output power is high.

Specifically, the conventional transmission circuit 600 previously has a first threshold value and a second threshold value, provided that the first threshold value > the second threshold value. When the output power is greater than the first threshold value, the conventional transmission circuit 600 connects an output of an AGC amplifier 610 to a base terminal of a power amplifier 611, connects an output of an amplitude modulation circuit 613 to a collector terminal of the power amplifier 611, and uses the polar modulation scheme to amplify an output signal. On the other hand, when the output power is smaller than the first threshold value and equal to or greater than the second threshold value, the conventional transmission circuit 600 connects the output of the AGC amplifier 610 to the base terminal of the power amplifier 611 but the output level is adjusted using the AGC amplifier 610, thereby the output signal is amplified using the linear region of the power amplifier 611. Furthermore, when the output power is smaller than the second threshold value, because, via the power amplifier 611, the quality of the signal may deteriorate due to the effect of distortion in the power amplifier 611, the conventional transmission circuit 600 connects an output of the AGC amplifier 610 to a buffer 612, and outputs the output signal without passing it through the power amplifier 611.

In this manner, the conventional transmission circuit 600 is operable at high precision and high efficiency. When the conventional transmission circuit 600 is used as a mobile wireless device, however, further reduction of the power consumption is required. In particular, most power is consumed by the power amplifier 611 which is a power amplification stage, and thus the reduction of the power consumption in the power amplifier 611 is further required.

Patent Literature 2 discloses a high frequency amplifier which switches a bias voltage by a bias switch along with operation conditions for a power amplifier. In general, for amplification of an analog FM modulation wave, transmission of only a phase change may be necessary, and therefore the use of a class C power amplifier which has high power conversion efficiency is preferred. On the other hand, in the case of a modulation scheme for a digitally modulated wave, for example, a π/4 shift QPSK-modulated wave, which should allow the transmission of both amplitude change and phase change, the use of a class A power amplifier which has excellent linearity is required. Patent Literature 2 discloses a configuration in that a bias voltage to be applied to an amplifying transistor is switched in accordance with a modulation signal, and thereby the operation region of the power amplifier is controlled.

FIG. 20 is a block diagram showing an example of a configuration of a conventional transmission circuit 700 disclosed in Patent Literature 2. In FIG. 20, a modulation wave inputted from an RF input terminal 711 is amplified by a power amplifier 712, and outputted from an antenna 713. The power amplifier 712 includes a grounded-emitter amplifying transistor 718, an input-side match section 717 connected to a base terminal of an amplifying transistor 718, and an output-side match section 719 connected to a collector terminal of the amplifying transistor 718.

A changeover control circuit 715 is connected by a bias switch 720 to the base terminal of the amplifying transistor 718 included in the power amplifier 712. In accordance with a control signal for selecting a modulation wave which is inputted from a control signal input terminal 714, the bias switch 720 connects the base terminal of the amplifying transistor 718 to a first bias circuit 722 or a second bias circuit 723. Specifically, in the case of causing the power amplifier 712 to act as a class C power amplifier, the bias switch 720 connects the base terminal of the amplifying transistor 718 to the first bias circuit 722.

On the other hand, in the case of causing the power amplifier 712 to act as a class A power amplifier, the bias switch 720 connects the base terminal of the amplifying transistor 718 to the second bias circuit 723. In this manner, in the conventional transmission circuit 700, bias circuits 722 and 723 are switched therebetween, depending on a type of modulation wave to be amplified by the power amplifier 712, and thereby the operation region of the power amplifier 712 is converted and the power conversion efficiency is improved.

CITATION LIST

Patent Literature

[Patent Literature 1] Japanese Laid-Open Patent Publication No. 2004-104194
[Patent Literature 2] Japanese Laid-Open Patent Publication No. H5-110348

Non Patent Literature

[Non-Patent Literature 1] "High-efficiency L-band Kahn-technique transmitter", 1998 IEEE MTT-S Int. Microwave Symp. Dig. by F. H. Raab, et al)

SUMMARY OF THE INVENTION

Problems to be Solved by the Invention

However, while switching of the operation mode of the transmission circuit in accordance with the output power in the conventional transmission circuit 600 is disclosed, a switching operation of the bias voltage of the power amplifier 611 is not disclosed. Because of this, the same bias voltage is applied to the power amplifier 611 when the quadrature modulation scheme is used and also when the polar modulation scheme is used. Therefore, the conventional transmission circuit 600 is insufficient in reducing power consumed in the power amplifier 611.

Also, in the conventional transmission circuit 700, due to delay of a switch operation when switching between the first bias circuit 722 and the second bias circuit 723 or due to a delay element present in control signal paths, a state in which the bias voltage is not applied to the power amplifier 712 (that is, an unbiased state) may occur when switching between the first bias circuit 722 and the second bias circuit 723.

The switch operation for switching the bias circuit will be described with reference to FIG. 21. Part (a) of FIG. 21 shows change in bias voltage when a control signal is inputted to the control signal input terminal 714 at time $t_0$ and the bias circuit is switched from the first bias circuit 722 to the second bias circuit 723. In FIG. 21(a), the bias voltage changes from $V_1$ to $V_2$ in a stepwise manner before and after the time $t_0$, respectively, due to the control signal inputted to the control signal input terminal 714.

Part (b) of FIG. 21 shows an example of occurrence of delay of a bias current to be applied to a bias control terminal of the amplifying transistor 718. Due to the delay characteristic of the bias switch 720 or the effect of a delay element present in transmission paths for a communication information signal, delay occurs in the switching operation of the bias current to be applied to the bias control terminal of the amplifying transistor 718 as shown in FIG. 21(b). In this example, delay time interval from when a control signal is inputted to the control signal input terminal 714 at the time $t_0$ to when the first bias circuit 722 is switched from on to off is indicated by $d_1$, and delay time interval from when the second bias circuit 723 is switched from off to on is indicated by $d_2$ ($d_2 > d_1$). In this case, both the first bias circuit 722 and the second bias circuit 723 are off during a period indicated by $T_1 = d_2 - d_1$, resulting in the amplifying transistor 718 being in the unbiased state.

That is, in the above-described transmission circuit 700, the amplifying transistor 718 does not normally operate in the unbiased state, and which may cause the output signal from the power amplifier 712 to be interrupted when switching the bias voltage. Therefore, there is a problem that the switching of the operation of power amplifier 712 is not conducted smoothly.

Also, even if the bias control technique disclosed in Patent Literature 2 is applied to the above-described transmission circuit 600, the amplifying transistor included in the power amplifier 611 cannot be prevented from being in the unbiased state. In addition, when switching the operation mode of the transmission circuit 600, inputs to the base terminal and the collector terminal of the power amplifier 611 are also switched. However, due to delay which occurs at the switching, the base terminal and the collector terminal of the power amplifier 611 can fall in a no input state. Because of such a cause, the transmission circuit 600 is unable to smoothly switch the operation mode.

Therefore, an object of the present invention is to provide a transmission circuit which solves the above described conventional problems, operates in a low distortion manner at high efficiency over a wide range of output power, and, when switching the operation mode of the transmission circuit, allows the operation mode to be switched smoothly.

Solution to the Problems

The present invention is directed to a transmission circuit which outputs a transmission signal. In order to achieve the above objects, the transmission circuit of the present invention includes a control section for determining whether to switch an operation mode of the transmission circuit to a quadrature modulation scheme or a polar modulation scheme, based on power information, and outputting a vector signal which includes I and Q signals when the operation mode of the transmission circuit is the quadrature modulation scheme, and outputting an amplitude signal and a phase signal when the operation mode of the transmission circuit is the polar modulation scheme; an amplitude phase modulation section for amplitude-phase modulating the vector signal outputted by the control section; a first variable gain amplifier for amplifying an output signal from the amplitude phase modulation section with a first gain; a regulator for outputting a voltage in accordance with the amplitude signal outputted by the control section; a phase modulation section for phase-modulating the phase signal outputted by the control section; a second variable gain amplifier for amplifying an output signal from the phase modulation section with a second gain; a power amplifier for receiving a predetermined direct-current voltage supplied thereto and amplifying an output signal from the first variable gain amplifier using the supplied predetermined direct-current voltage when the operation mode of the transmission circuit is the quadrature modulation scheme, and for receiving the voltage in accordance with the amplitude signal supplied thereto by the regulator and amplifying an output signal from the second variable gain amplifier using the supplied voltage when the operation mode of the transmission circuit is the polar modulation scheme; and a bias circuit for outputting a bias control signal to the power amplifier. The power amplifier includes: a first input terminal to which the direct-current voltage or the voltage in accordance with the amplitude signal is supplied; a second input terminal to which the output signal from the first variable gain amplifier or the output signal from the second variable gain amplifier is inputted; and a third input terminal to which the bias control signal is inputted. The control section controls switching of the operation mode of the transmission circuit so that at least one of the first input terminal and the second input terminal is prevented from being in a no input state.

Preferably, the bias circuit is configured of: a first bias circuit for outputting a first bias control signal to the power amplifier when the operation mode of the transmission circuit is the quadrature modulation scheme; and a second bias circuit for outputting a second bias control to the power amplifier when the operation mode of the transmission circuit is the polar modulation scheme. In this case, the control section controls the switching of the operation mode of the transmission circuit so that at least one of the first input terminal, the second input terminal, and the third input terminal is prevented from being in the no input state.

The regulator may supply the power amplifier with the predetermined direct-current voltage when the operation mode of the transmission circuit is the quadrature modulation scheme, and supply the power amplifier with the voltage in accordance with the amplitude signal outputted by the control section when the operation mode of the transmission circuit is the polar modulation scheme.

Preferably, the transmission circuit further includes a third variable gain amplifier for amplifying, with a third gain, the amplitude signal outputted by the control section.

The transmission circuit further includes: a first delay adjustment circuit for delaying switching of the direct-current voltage to be supplied to the power amplifier a first delay time; and a second delay adjustment circuit for delaying switching of the direct-current voltage supplied to drive the regulator a second delay time. The control section adjusts the first delay time and the second delay time so that one of the direct-current voltage and the voltage in accordance with the amplitude signal is surely supplied to the first input terminal of the power amplifier.

The transmission circuit further includes: a third delay adjustment circuit for delaying switching of an operation of the first variable gain amplifier a third delay time; and a fourth delay adjustment circuit for delaying switching of an operation of the second variable gain amplifier a fourth delay time. The control section adjusts the third delay time and the fourth delay time so that one of the output signal from the first variable gain amplifier and the output signal from the second variable gain amplifier is surely inputted to the second input terminal of the power amplifier.

The transmission circuit further includes: a fifth delay adjustment circuit for delaying switching of an operation of the first bias circuit a fifth delay time; and a sixth delay adjustment circuit for delaying switching an operation of the second bias circuit a sixth delay time. The control section adjusts the fifth delay time and the sixth delay time so that one of the first bias control signal and the second bias control signal is surely inputted to the third input terminal of the power amplifier.

The control section includes: a signal generation section for generating the vector signal when the operation mode of the transmission circuit is the quadrature modulation scheme, and generating the amplitude signal and the phase signal when the operation mode of the transmission circuit is the polar modulation scheme; a bias control section for controlling the operation mode of the transmission circuit so that, when switching the operation mode of the transmission circuit, at least one of the following conditions is satisfied: at least one of the direct-current voltage and the voltage in accordance with the amplitude signal is surely supplied to the first input terminal of the power amplifier; at least one of the output signal from the first variable gain amplifier and the output signal from the second variable gain amplifier is surely inputted to the second input terminal of the power amplifier; and at least one of the first bias control signal and the second bias control signal is surely inputted to the third input terminal of the power amplifier; a mode switching determination section for determining whether to switch the operation mode to the quadrature modulation scheme or the polar modulation scheme, based on the power information; and a mode switching control section for controlling the signal generation section and the bias control section, in accordance with determination by the mode switching determination section.

Preferably, the mode switching determination section determines whether to switch the operation mode of the transmission circuit to the quadrature modulation scheme or the polar modulation scheme, based on a lookup table defining the operation mode and in accordance with the power information.

Also, the mode switching determination section may determine that the transmission circuit is to be caused to operate in the quadrature modulation scheme if the power information is smaller than a predetermined threshold value, and determine that the transmission circuit is to be caused to operate in the polar modulation scheme if the power information is equal to or greater than the predetermined threshold value.

The transmission circuit further includes: a distributer for distributing the transmission signal outputted from the power amplifier; and a detector for detecting an output power of the distributer, and outputting a voltage value in proportion to the output power when switching the operation mode of the transmission circuit. The control section further includes: a comparison section for comparing a voltage value detected by the detector before the operation mode of the transmission circuit is switched and a voltage value detected by the detector after the operation mode of the transmission circuit is switched, and outputting a difference therebetween; and a gain control section for controlling at least one of the first gain and the second gain, based on the difference outputted by the comparison section and the power information so that the output power of the power amplifier converges to a target output power level.

The transmission circuit further includes: a distributer for distributing the transmission signal outputted from the power amplifier; and a detector for detecting an output power of the distributer and outputting a voltage value in proportion to the output power when switching the operation mode of the transmission circuit. The control section further includes: a comparison section for comparing a voltage value detected by the detector before the operation mode of the transmission circuit is switched and a voltage value detected by the detector after the operation mode of the transmission circuit is switched, and outputting a difference therebetween; and a gain control section for controlling at least one of the first gain, the second gain, and the third gain, based on the difference outputted by the comparison section and the power information so that an output power of the power amplifier converges to a target output power level.

When the operation mode of the transmission circuit is switched, the control section converges the output power of the power amplifier to the target output power level within predetermined time periods before and after a boundary between symbols.

The transmission circuit further includes: a first DC power generation section for supplying the direct-current voltage to the first input terminal of the power amplifier when the operation mode of the transmission circuit is the quadrature modulation scheme; and a second DC power generation section for supplying a direct-current voltage that drives the regulator when the operation mode of the transmission circuit is the polar modulation scheme.

The transmission circuit further includes: a third DC power generation section for supplying a direct-current voltage that drives the first variable gain amplifier when the operation mode of the transmission circuit is the quadrature modulation scheme, and a fourth DC power generation section for supplying a direct-current voltage that drives the first variable gain amplifier when the operation mode of the transmission circuit is the polar modulation scheme.

The transmission circuit further includes: a fifth DC power supply generation section for supplying a direct-current voltage that drives the first bias circuit when the operation mode of the transmission circuit is the quadrature modulation scheme, and a sixth DC power supply generation section for supplying a direct-current voltage that drives the second bias circuit when the operation mode of the transmission circuit is the polar modulation scheme.

The transmission circuit further comprising: a first DAC connected to digital-to-analog convert the I signal outputted by the control section to output a resultant signal to the amplitude phase modulation section when switching the operation mode of the transmission circuit from the polar modulation scheme to the quadrature modulation scheme, and connected to digital-to-analog convert the amplitude signal outputted by the control section to output a resultant signal to the regulator when switching the operation mode of the transmission circuit from the quadrature modulation scheme to the polar modulation scheme; a second DAC connected to digital-to-analog convert the Q signal outputted by the control section to output a resultant data to the amplitude phase modulation section when switching the operation mode of the transmission circuit from the polar modulation scheme to the quadrature modulation scheme, and connected to digital-to-analog convert the phase signal outputted by the control section to output a resultant signal to the phase modulation section when switching the operation mode of the transmission circuit from the quadrature modulation scheme to the polar modulation scheme; and a DC power supply generation section for supplying a direct-current voltage to the regulator when switching the operation mode of the transmission circuit from the polar modulation scheme to the quadrature modulation scheme, so that the first input terminal of the power amplifier is prevented from being in the no input state, and supplying a direct-current voltage to the amplitude phase modulation section when switching the operation mode of the transmission circuit from the quadrature modulation scheme to the polar modulation scheme, so that the second input terminal of the power amplifier is prevented from being in the no input state.

For switching the operation mode of the transmission circuit from the quadrature modulation scheme to the polar modulation scheme, given that the first delay time is $t_1$ and the second delay time is $t_2$, the first delay time $t_1$ and the second delay time $t_2$ are set so as to satisfy a relationship of a following equation:

$$t_1+\min(d_1)>t_2+\max(d_2),$$

where min ($d_1$) denotes a minimal value of a delay time $d_1$ which occurs in a path from the control section to the first input terminal of the power amplifier, exclusive of the first delay time $t_1$, and max ($d_2$) denotes a maximal value of a delay time $d_2$ which occurs in a path from the control section to the first input terminal of the power amplifier via the regulator, exclusive of the second delay time $t_2$.

For switching the operation mode of the transmission circuit from the polar modulation scheme to the quadrature modulation scheme, the first delay time $t_1$ and the second delay time $t_2$ are set so as to satisfy a relationship of a following equation:

$$t_1+\max(d_1)<t_2+\min(d_2),$$

where max ($d_1$) denotes a maximal value of a delay time $d_1$ which occurs in a path from the control section to the first input terminal of the power amplifier, exclusive of the first delay time $t_1$, and min ($d_2$) denotes a minimal value of a delay time $d_2$ which occurs in a path from the control section to the first input terminal of the power amplifier via the regulator, exclusive of the second delay time $t_2$.

For switching the operation mode of the transmission circuit from the quadrature modulation scheme to the polar modulation scheme, given that the third delay time is $t_3$ and the fourth delay time is $t_4$, the third delay time $t_3$ and the fourth delay time $t_4$ are set so as to satisfy a relationship of a following equation:

$$t_3+\min(d_3)>t_4+\max(d_4),$$

where min ($d_3$) denotes a minimal value of a delay time $d_3$ which occurs in a path from the control section to the second input terminal via the amplitude phase modulation section and the first variable gain amplifier, exclusive of the third delay time $t_3$, and max ($d_4$) denotes a maximal value of delay time $d_4$ which occurs in a path from the control section to the second input terminal via the phase modulation section and the second variable gain amplifier, exclusive of the third delay time $t_3$.

For switching the operation mode of the transmission circuit from the polar modulation scheme to the quadrature modulation scheme, the third delay time $t_3$ and the fourth delay time $t_4$ are set so as to satisfy a relationship of a following equation:

$$t_3+\max(d_3)<t_4+\min(d_4),$$

where max ($d_3$) denotes a maximal value of a delay time $d_3$ which occurs in a path from the control section to the second input terminal via the amplitude phase modulation section and the first variable gain amplifier, exclusive of the third delay time $t_3$, and min ($d_4$) denotes a minimal value of the delay time $d_4$ which occurs in a path from the control section to the second input terminal via the phase modulation section and the second variable gain amplifier, exclusive of the fourth delay time $t_4$.

For switching the operation mode of the transmission circuit from the quadrature modulation scheme to the polar modulation scheme, given that the fifth delay time is $t_5$ and the sixth delay time is $t_6$, the fifth delay time $t_5$ and the sixth delay time $t_6$ are set so as to satisfy a relationship of a following equation:

$$t_5 + \min(d_5) > t_6 + \max(d_6),$$

where min ($d_5$) denotes a minimal value of a delay time $d_5$ which occurs in a path from the control section to the third input terminal via the first bias circuit, exclusive of the fifth delay time $t_5$, and max ($d_6$) denotes a maximal value of a delay time $d_6$ which occurs in a path from the control section to the third input terminal via the second bias circuit, exclusive of the sixth delay time $t_6$.

For switching the operation mode of the transmission circuit from the polar modulation scheme to the quadrature modulation scheme, the fifth delay time $t_5$ and the sixth delay time $t_6$ are set so as to satisfy a relationship of a following equation:

$$t_5 + \max(d_5) < t_6 + \min(d_6),$$

where max ($d_5$) denotes a maximal value of a delay time $d_5$ which occurs in a path from the control section to the third input terminal via the first bias circuit, exclusive of the fifth delay time $t_5$, and min ($d_6$) denotes a minimal value of a delay time $d_6$ which occurs in a path from the control section to the third input terminal via the second bias circuit, exclusive of the sixth delay time $t_6$.

Also, the present invention is also directed to a communication device which includes the transmission circuit described above. The communication device includes a transmission circuit for generating a transmission signal; and an antenna for outputting the transmission signal generated by the transmission circuit. Also, the communication device may further include: a reception circuit for processing a reception signal received from the antenna; and an antenna duplexer for outputting the transmission signal generated by the transmission circuit to the antenna, and outputting the reception signal received from the antenna to the reception circuit.

Advantageous Effects of the Invention

As described above, the transmission circuit of the present invention adjusts a timing of switching a voltage to be supplied to the collector terminal of the power amplifier when switching the operation mode, thereby preventing the collector terminal of the power amplifier from being in the no input state. Also, the transmission circuit adjusts a switching timing between the first variable gain amplifier and the second variable gain amplifier, thereby preventing the base terminal of the power amplifier from being in the no input state. Also, when switching the operation mode, the transmission circuit adjusts the switching timing between the first bias circuit and the second bias circuit, thereby preventing the power amplifier from being in the unbiased state. This allows, when switching the operation mode, the transmission circuit to prevent the interruption of the output signal from the power amplifier, and allows the operation mode to be smoothly switched.

Also, since, in the transmission circuit, the output signal from the power amplifier, which is a feedback signal, is not interrupted when switching the operation mode, a detector is able to quickly detect the variation of the output power of the power amplifier. This allows the transmission circuit to inhibit in a short time the discontinuous variation of the output power, along with the switching of the operation mode.

Also, according to the communication device of the present invention, the use of the above-described transmission circuit ensures the output signal accuracy over a wide bandwidth and allows the operation at high efficiency.

BRIEF DESCRIPTION OF THE DRAWINGS

FIG. 4 is a diagram showing an example of a lookup table in which the relationship between power information P and operation modes of the transmission circuit 1.

FIG. 6B is a block diagram showing an example of a configuration of a delay adjustment circuit 21.

FIG. 9A is a diagram showing an example of the relationship between input voltages and output currents of the first bias circuit 15 and the second bias circuit 16, respectively, when switching from the first bias circuit 15 to the second bias circuit 16.

DESCRIPTION OF EMBODIMENTS

First Embodiment

Figure 1:
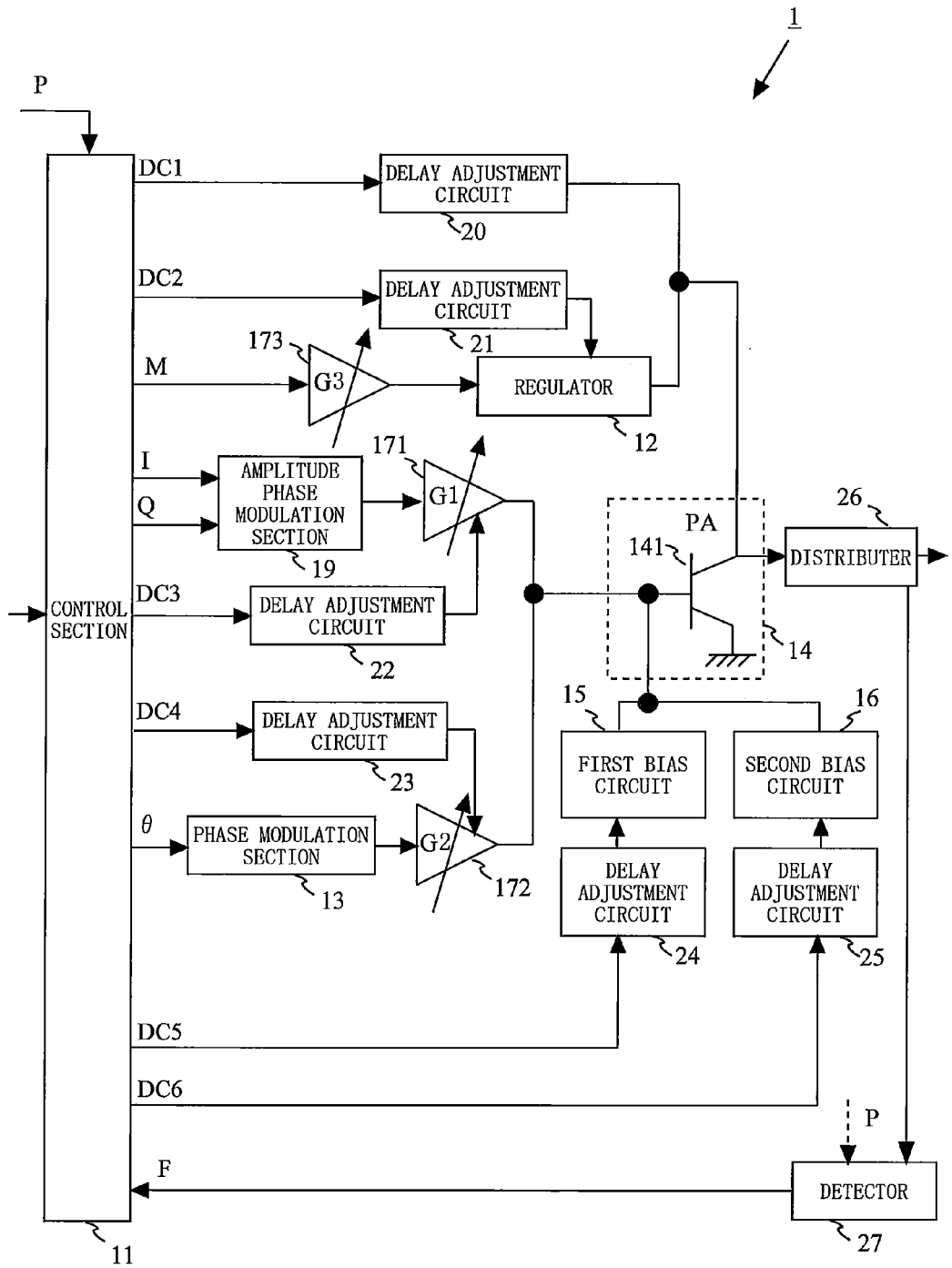
FIG. 1 is a block diagram showing an example of a configuration of a transmission circuit 1 according to a first embodiment of the present invention.

FIG. 1 is a block diagram showing an example of a configuration of a transmission circuit 1 according to a first embodiment of the present invention. In FIG. 1, the transmission circuit 1 includes a control section 11, a regulator 12, a phase modulation section 13, a power amplifier (PA) 14, a first bias circuit 15, a second bias circuit 16, a first variable gain amplifier 171, a second variable gain amplifier 172, a third variable gain amplifier 173, an amplitude phase modulation section 19, delay adjustment circuits 20, 21, 22, 23, 24, and 25, a distributer 26, and a detector 27. The power amplifier 14 includes an amplifying transistor 141.

A baseband signal and power information P are inputted to the transmission circuit 1. The power information P is information indicative of the magnitude of output power of the transmission circuit 1, and is, in the W-CDMA system for example, controlled per slot time by a base station.

The control section 11 controls an operation of switching the operation mode of the transmission circuit 1 to the quadrature modulation scheme or the polar modulation scheme. In addition, when the operation mode of the transmission circuit 1 is the quadrature modulation scheme, the control section 11 outputs a vector signal which includes I and Q signals. On the other hand, when the operation mode of the transmission circuit 1 is the polar modulation scheme, the control section 11 outputs an amplitude signal M and a phase signal θ. The relationships of the amplitude signal M and the phase signal θ with the I and Q signals are represented by (Equation 1) and (Equation 2). Details of the control section 11 will be described below.

$$M = \sqrt{I^2 + Q^2}\,\Gamma \qquad \text{(Equation 1)}$$

$$\Gamma\theta = \arg(I + jQ) = \tan^{-1}(Q/I) \qquad \text{(Equation 2)}$$

When the operation mode of the transmission circuit 1 is the quadrature modulation scheme, the control section 11 outputs the I and Q signals. The I and Q signals are modulated by the amplitude phase modulation section 19, thereafter amplified by the power amplifier 14 via the first variable gain amplifier 171, and outputted therefrom as a modulation signal. The modulation signal is outputted as a transmission signal from the transmission circuit 1.

Also, when the operation mode of the transmission circuit 1 is the polar modulation scheme, the control section 11 outputs the amplitude signal M and the phase signal θ. The amplitude signal M is inputted to the regulator 12 via the third variable gain amplifier 173. The regulator 12 supplies a voltage in accordance with the amplitude signal M to the power amplifier 14. Typically, the regulator 12 supplies a voltage in proportion to the magnitude of amplitude signal to the power amplifier 14.

The phase signal is inputted to the phase modulation section 13. The phase modulation section 13 phase-modulates the phase signal and outputs the phase-modulated signal. The phase-modulated signal is inputted to the power amplifier 14 via the second variable gain amplifier 172. The power amplifier 14 amplitude-modulates the phase-modulated signal using the voltage supplied by the regulator 12 and outputs the resultant signal as a modulation signal that is phase-modulated and amplitude-modulated. The modulation signal is outputted as a transmission signal from the transmission circuit 1.

Figure 2A:
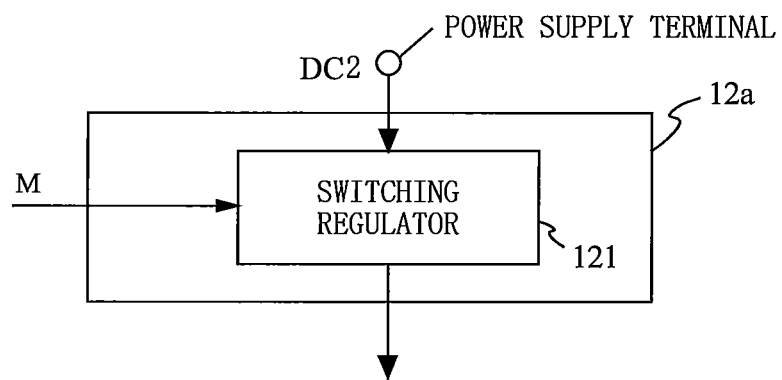
FIG. 2A is a block diagram showing an example of a configuration of a regulator 12a according to the first embodiment of the present invention.

The regulator 12 can be, like a regulator 12a shown in FIG. 2A, configured with a switching regulator 121, for example. A bias control signal DC2 is inputted to a power supply terminal of the switching regulator 121 via a delay adjustment circuit 21. The switching regulator 121 supplies the voltage in accordance with the amplitude signal M to the power amplifier 14.

Figure 2B:
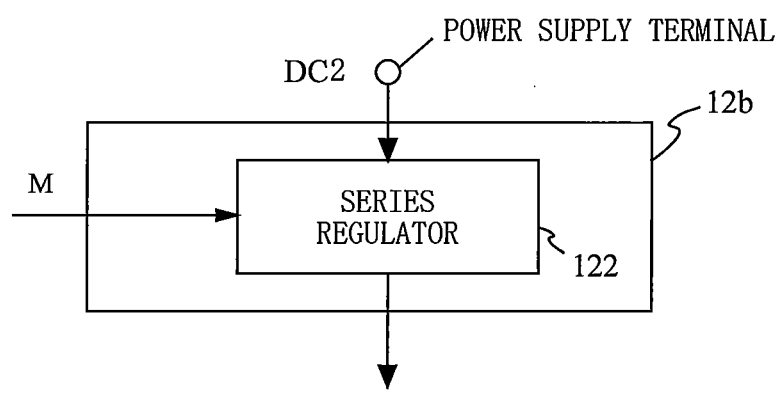
FIG. 2B is a block diagram showing an example of a configuration of a regulator 12b according to the first embodiment of the present invention.

Also, the regulator 12 can be, like a regulator 12b shown in FIG. 2B, configured with a series regulator 122, for example. The bias control signal DC2 is inputted to a power supply terminal of the series regulator 122 via the delay adjustment circuit 21. The series regulator 122 supplies the voltage in accordance with the amplitude signal M to the power amplifier 14.

Figure 2C:
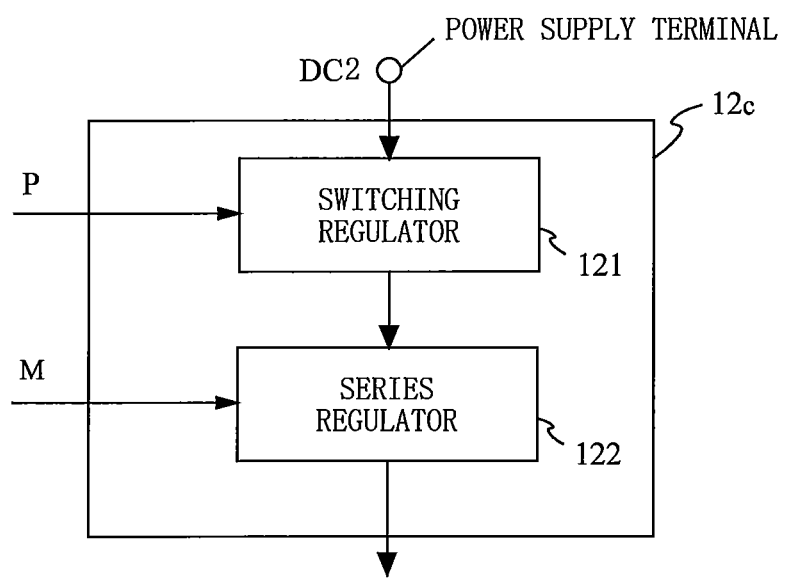
FIG. 2C is a block diagram showing an example of a configuration of a regulator 12c according to the first embodiment of the present invention.

Also, the regulator 12 can be, like a regulator 12c shown in FIG. 2C, configured with a combination of the switching regulator 121 and the series regulator 122, for example. The bias control signal DC2 is inputted to the power supply terminal of the switching regulator 121 via the delay adjustment circuit 21. Also, for example, the power information P is inputted to the switching regulator 121. Also, instead of the power information P, for example, a signal obtained by averaging the amplitude signal M per unit of time may be inputted to the switching regulator 121. The switching regulator 121 supplies a voltage in accordance with an input signal, such as the power information P, to the series regulator 122. The series regulator 122 supplies the voltage in accordance with the amplitude signal M to the power amplifier 14. Also, the regulator 12 can be configured with a current-driven regulator.

Figure 3:
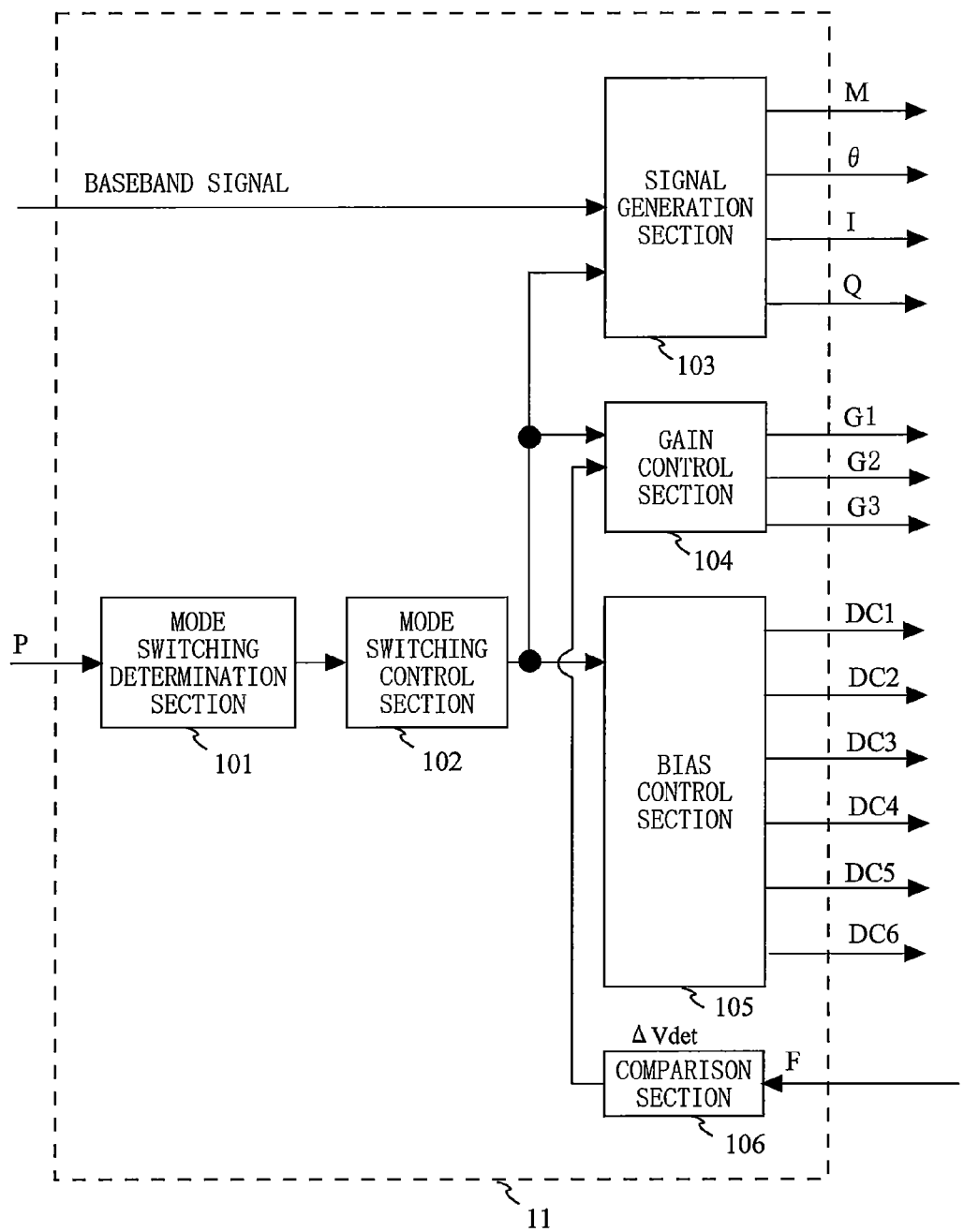
FIG. 3 is a block diagram showing in detail an example of a configuration of a control section 11 according to the first embodiment of the present invention.

Next, the control section 11 will be described in detail. FIG. 3 is a block diagram showing in detail an example of the configuration of the control section 11. In FIG. 3, the control section 11 includes a mode switching determination section 101, a mode switching control section 102, a signal generation section 103, a gain control section 104, a bias control section 105, and a comparison section 106. It should be noted that while the control section 11 in FIG. 3 is described as a collection of a plurality of functional blocks, the control section 11 may be implemented as one functional block.

The mode switching determination section 101 is a functional block which determines whether to switch the operation mode of the transmission circuit 1 to the polar modulation scheme or the quadrature modulation scheme, in accordance with the power information P. An example of the determination method is that the mode switching determination section 101 determines whether to switch the operation mode of the transmission circuit 1, based on a lookup table (for example, see FIG. 4) in which the relationship between the power information P and the operation mode of the transmission circuit 1 is described.

Figure 5:
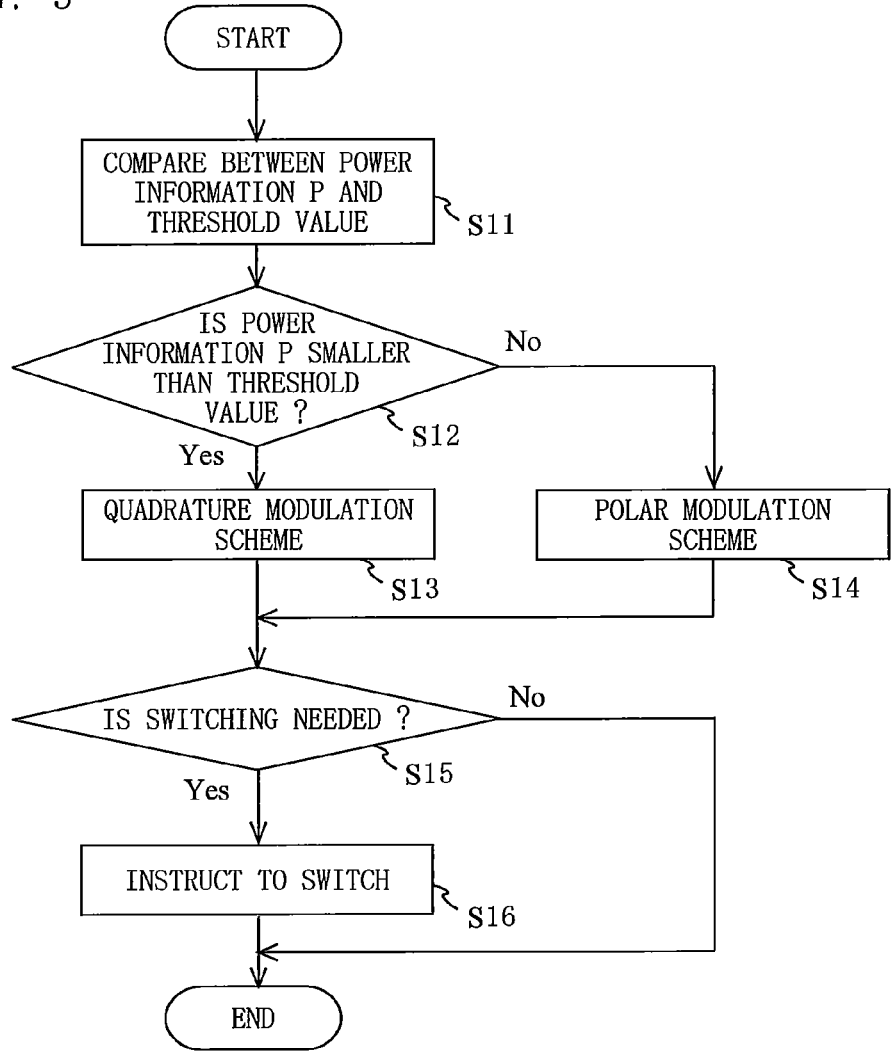
FIG. 5 is a flowchart showing an example of an operation of a mode switching determination section 101 when switching the mode.

Alternatively, instead of having the lookup table included therein, the mode switching determination section 101 may determine whether to switch the operation mode of the transmission circuit 1 by comparing the power information P with a predetermined threshold value, as shown in FIG. 5. FIG. 5 is a flowchart showing an example of the operation of the mode switching determination section 101 when switching the mode. Referring to FIG. 5, the mode switching determination section 101 compares the power information P with a predetermined threshold value (step S11). Then, if the power information P is smaller than the predetermined threshold value, the mode switching determination section 101 determines that the subsequent operation mode is the quadrature modulation scheme (step S12: Yes, step S13).

On the other hand, if the power information P is equal to or greater than the predetermined threshold value, the mode switching determination section 101 determines that the subsequent operation mode is the polar modulation scheme (step S12: No, step S14). If the current operation mode is different from the subsequent operation mode, the mode switching determination section 101 determines that the operation mode needs to be switched, and instructs the mode switching control section 102 to switch the operation mode (step S15: Yes, step S16). If the current operation mode and the subsequent operation mode are the same, the mode switching determination section 101 determines that there is no need to switch the operation mode, and terminates the process (step S15: No).

It should be noted that the number of threshold values to be compared with the power information P is not limited to 1, and may be a plurality. For example, the mode switching determination section 101 may have two threshold values: a first threshold value for determining the switching from the quadrature modulation scheme to the polar modulation scheme; and a second threshold value for determining the switching from the quadrature modulation scheme to the polar modulation scheme. This allows the mode switching determination section 101 to determine that the subsequent operation mode is the polar modulation scheme if the power information P is equal to or greater than the first threshold value, and that the subsequent operation mode is the quadrature modulation scheme if the power information P is smaller than the second threshold value.

The mode switching control section 102 controls the switching of operation modes at the signal generation section 103, the gain control section 104, and the bias control section 105, in accordance with the determination by the mode switching determination section 101.

The signal generation section 103 switches a type of signal to generate, in accordance with control by the mode switching control section 102. Specifically, if the operation mode of the transmission circuit 1 is the quadrature modulation scheme, the signal generation section 103 applies predetermined signal processing to a baseband signal to output the vector signal which includes the I and Q signals. On the other hand, if the operation mode of the transmission circuit 1 is the polar modulation scheme, the signal generation section 103 applies predetermined signal processing to the baseband signal to generate the amplitude signal M and the phase signal θ. The relationships of the amplitude signal M and the phase signal θ with the I and Q signals are as described above.

Also, the output signal from the power amplifier 14 is fed back to the comparison section 106 via the distributer 26 and the detector 27. The comparison section 106 and the gain control section 104 control gain G1 of the first variable gain amplifier 171, gain G2 of the second variable gain amplifier 172, and gain G3 of the third variable gain amplifier 173, based on the output signal from the power amplifier 14, so that the output of the power amplifier 14 is stabilized. The distributer 26, the detector 27, the comparison section 106, and the gain control section 104 will be described in detail below.

The bias control section 105 outputs bias control signals DC1 and DC2, in accordance with control by the mode switching control section 102, to control the switching of the voltage to be supplied to the power amplifier 14 (that is, a collector terminal of the amplifying transistor 141). Also, the bias control section 105 outputs bias control signals DC3 and DC4, in accordance with control by the mode switching control section 102, to control the switching between the first variable gain amplifier 171 and the second variable gain amplifier 172. Moreover, the bias control section 105 outputs bias control signals DC5 and DC6, in accordance with control by the mode switching control section 102, to control the switching between the first bias circuit 15 and the second bias circuit 16.

It should be noted that, at the switching of the operation mode of the transmission circuit 1, the bias control section 105 does not necessarily output all of a set of the bias control signals DC1 and DC2, a set of the bias control signals DC3 and DC4, and a set of the bias control signals DC5 and DC6, and may output at least one set of bias control signals.

Here, the operation when the bias control section 105 outputs the bias control signals DC1 and DC2 and switches a voltage to be supplied to the collector terminal of the amplifying transistor 141 will be described in detail. For example, for switching from the polar modulation scheme to the quadrature modulation scheme, the bias control section 105 outputs the bias control signal DC1 that satisfies $DC1>V_{th1}$ and the bias control signal DC2 that satisfies $DC2<V_{th2}$ to turn on the direct-current voltage to be supplied to the collector terminal of the amplifying transistor 141 and turn off a supply voltage to be supplied to the power supply terminal of the regulator 12, respectively. This supplies the direct-current voltage in accordance with the bias control signal DC1 to the collector terminal of the amplifying transistor 141.

Also, on the contrary, for switching from the quadrature modulation scheme to the polar modulation scheme, the bias control section 105 outputs the bias control signal DC1 that satisfies $DC1<V_{th1}$ and the bias control signal DC2 that satisfies $DC2>V_{th2}$ to turn off the direct-current voltage to be supplied to the collector terminal of the amplifying transistor 141 and turn on the direct-current voltage to be supplied to the power supply terminal of the regulator 12, respectively. This supplies the power supply terminal of the regulator 12 with the direct-current voltage in accordance with the bias control signal DC2. That is, the collector terminal of the amplifying transistor 141 is supplied with the voltage in accordance with the amplitude signal M.

Here, the $V_{th1}$ and $V_{th2}$ are threshold values defining on states of the bias control signals DC1 and DC2, respectively, and can be set arbitrarily. That is, the bias control signals DC1 and DC2 are signals for controlling the on/off state of the direct-current voltage to be supplied to the collector terminal of the amplifying transistor 141 and the on/off state of the direct-current voltage to be supplied to the power supply terminal of the regulator 12, respectively, and thus, any voltage values may be used if its object can be attained. Furthermore, depending on the types of the power amplifier 14 and the regulator 12, current values may be used as the bias control signals DC1 and DC2.

The delay adjustment circuit 20 delays the bias control signal DC1 a predetermined time $t_1$. The delay adjustment circuit 21 delays the bias control signal DC2 a predetermined time $t_2$. Thus, the delay adjustment circuit 20 delays the switching of the direct-current voltage to be supplied to the collector terminal of the amplifying transistor 141 the predetermined time $t_1$. Likewise, the delay adjustment circuit 21 delays the switching of the direct-current voltage to be supplied to the power supply terminal of the regulator 12 the predetermined time $t_2$. The delay times $t_1$ and $t_2$ are adjusted so that the collector terminal of the amplifying transistor 141 when switching the operation mode of the transmission circuit 1 is prevented from being in the no input state.

Here, a delay time which occurs in a path from the bias control section 105 to the collector terminal of the amplifying transistor 141 is indicated by $d_1$, exclusive of the delay time $t_1$ caused by the delay adjustment circuit 20. A delay time which occurs in a path from the bias control section 105 to the collector terminal of the amplifying transistor 141 via the regulator 12 is indicated by $d_2$, exclusive of the delay time $t_2$ caused by the delay adjustment circuit 21.

In this case, a delay time in the path from the bias control section 105 to the collector terminal of the amplifying transistor 141 in combination with the delay time $t_1$ caused by the delay adjustment circuit 20 is $t_1+d_1$. A delay time in the path from the bias control section 105 to the collector terminal of the amplifying transistor 141 via the regulator 12 in combination with the delay time $t_2$ caused by the delay adjustment circuit 21 is $t_2+d_2$.

That is, for switching from the quadrature modulation scheme to the polar modulation scheme, a condition $t_1+d_1 > t_2+d_2$ needs to be satisfied so that the collector terminal of the amplifying transistor 141 is prevented from being in the no input state. On the contrary, for switching from the polar modulation scheme to the quadrature modulation scheme, a condition $t_1+d_1 < t_2+d_2$ needs to be satisfied so that the collector terminal of the amplifying transistor 141 is prevented from being in the no input state.

Here, the delay times $d_1$ and $d_2$ vary depending on variation of a circuit element, change in temperature, or the like. Therefore, for switching from the quadrature modulation scheme to the polar modulation scheme, the delay times $t_1$ and $t_2$ need to be set so that a condition $t_1+\min(d_1) > t_2+\max(d_2)$ is satisfied, where $\min(d_1)$ denotes a minimal value of the delay time $d_1$ and $\max(d_2)$ denotes a maximal value of the delay time $d_2$. On the contrary, for switching from the polar modulation scheme to the quadrature modulation scheme, the delay times $t_1$ and $t_2$ need to be set so that a condition $t_1+\max(d_1) < t_2+\min(d_2)$ is satisfied, where $\max(d_1)$ denotes a maximal value of the delay time $d_1$ and $\min(d_2)$ denotes a minimal value of the delay time $d_2$.

Figure 6A:
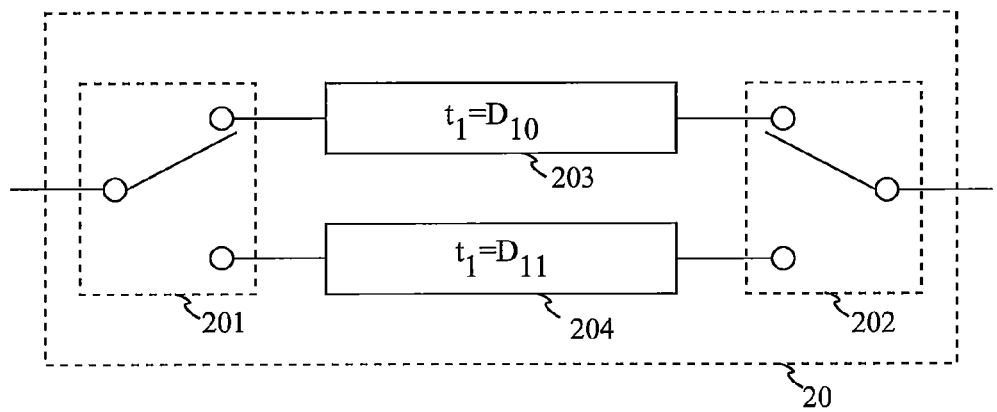
FIG. 6A is a block diagram showing an example of a configuration of a delay adjustment circuit 20.

FIG. 6A is a block diagram showing an example of a configuration of the delay adjustment circuit 20. In FIG. 6A, the delay adjustment circuit 20 is configured with a first high speed switch 201, a second high speed switch 202, a first transmission line 203, and a second transmission line 204. The first transmission line 203 is a transmission line which provides low-delay, and the delay time is $D_{10}$. On the other hand, the second transmission line 204 is a transmission line which provides large delay, and the delay time is $D_{11}$. Switching of the first high speed switch 201 and the second high speed switch 202 sets $D_{10}$ or $D_{11}$ to the delay time $t_1$.

FIG. 6B is a block diagram showing an example of a configuration of the delay adjustment circuit 21. In FIG. 6B, the delay adjustment circuit 21 is configured with a first high speed switch 211, a second high speed switch 212, a first transmission line 213, and a second transmission line 214. The first transmission line 213 is a transmission line which provides low-delay, and the delay time is $D_{20}$. On the other hand, the second transmission line 214 is a transmission line which provides large delay, and the delay time is $D_{21}$. Switching of the high speed switches 211 and 212 sets $D_{20}$ or $D_{21}$ to the delay time $t_2$.

For switching from the quadrature modulation scheme to the polar modulation scheme, the following setting is made: $t_1=D_{11}$ and $t_2=D_{20}$, and for switching from the polar modulation scheme to the quadrature modulation scheme, the following setting is made: $t_1=D_{10}$ and $t_2=D_{21}$. $D_{11}$ satisfies $(D_{11}-D_{20}) > \max(d_2)-\min(d_1)$, and $D_{21}$ satisfies $(D_{21}-D_{10}) > \max(d_1)-\min(d_2)$.

After the switching of the bias circuit, values are set to $t_1$ and $t_2$ to prepare for the subsequent switching. For example, after switching from the quadrature modulation scheme to the polar modulation scheme, the following setting is made: $t_1=D_{10}$ and $t_2=D_{21}$. On the contrary, after switching from the polar modulation scheme to the quadrature modulation scheme, the following setting is made: $t_1=D_{11}$ and $t_2=D_{20}$. By thus controlling the delay time, the collector terminal of the amplifying transistor 141 is continuously supplied with the direct-current voltage in accordance with the bias control signal DC1 or the voltage in accordance with the amplitude signal M, thereby preventing the collector terminal of the amplifying transistor 141 from being in the no input state.

It should be noted that if the collector terminal of the amplifying transistor 141 can be prevented from being in the no input state when $t_1=0$, the transmission circuit 1 does not need to include the delay adjustment circuit 20. Likewise, if the collector terminal of the amplifying transistor 141 can be prevented from being in the no input state when $t_2=0$, the transmission circuit 1 does not need to include the delay adjustment circuit 21.

Next, operation when the bias control section 105 outputs the bias control signals DC3 and DC4 and switches between the first variable gain amplifier 171 and the second variable gain amplifier 172 will be described. When instructed from the mode switching control section 102 to switch the operation mode, the bias control section 105 outputs the bias control signal DC3 to the first variable gain amplifier 171 via the delay adjustment circuit 22. The bias control section 105 also outputs the bias control signal DC4 to the second variable gain amplifier 172 via the delay adjustment circuit 23.

Specifically, for switching from the polar modulation scheme to the quadrature modulation scheme, the bias control section 105 outputs the bias control signal DC3 that satisfies DC3>$V_{th3}$ and the bias control signal DC4 that satisfies DC4<$V_{th4}$ to turn on the first variable gain amplifier 171 and turn off the second variable gain amplifier 172, respectively. Also, on the contrary, for switching from the quadrature modulation scheme to the polar modulation scheme, the bias control section 105 outputs the bias control signal DC3 that satisfies DC3<$V_{th3}$ and the bias control signal DC4 that satisfies DC4>$V_{th4}$ to turn off the first variable gain amplifier 171 and turn on the second variable gain amplifier 172, respectively.

Here, the $V_{th3}$ and $V_{th4}$ are threshold values defining the on states of the bias control signals DC3 and DC4, respectively, and can be set arbitrarily. That is, the bias control signals DC3 and DC4 are signals for controlling the on/off states of the first variable gain amplifier 171 and the second variable gain amplifier 172, respectively, and thus, any voltage value may be used if its object can be attained. Furthermore, depending on types of the first variable gain amplifier 171 and the second variable gain amplifier 172, current values may be used as the bias control signals DC3 and DC4.

The delay adjustment circuit 22 delays the bias control signal DC3 a predetermined time $t_3$. The delay adjustment circuit 23 delays the bias control signal DC4 a predetermined time $t_4$. Thus, the delay adjustment circuit 22 delays the switching of the first variable gain amplifier 171 the predetermined time $t_3$. Likewise, the delay adjustment circuit 23 delays the switching of the second variable gain amplifier 172 the predetermined time $t_4$. The predetermined times $t_3$ and $t_4$ are adjusted so that a base terminal of the amplifying transistor 141 when switching the operation mode of the transmission circuit 1 is prevented from being in the no input state.

Here, a delay time which occurs in a path from the bias control section 105 to the base terminal of the amplifying transistor 141 via the amplitude phase modulation section 19 and the first variable gain amplifier 171 is indicated by $d_3$, exclusive of the delay time $t_3$ caused by the delay adjustment circuit 22. Also, a delay time which occurs in a path from the bias control section 105 to the base terminal of the amplifying transistor 141 via the phase modulation section 13 and the second variable gain amplifier 172 is indicated by $d_4$, exclusive of the delay time $t_4$ caused by the delay adjustment circuit 23.

In this case, the delay time in the path from the bias control section 105 to the base terminal of the amplifying transistor 141 via the amplitude phase modulation section 19 and the first variable gain amplifier 171 in combination with the delay time $t_3$ caused by the delay adjustment circuit 22 is $t_3+d_3$. Also, the delay time in the path from the bias control section 105 to the base terminal of the amplifying transistor 141 via the phase modulation section 13 and the second variable gain amplifier 18 in combination with the delay time $t_4$ caused by the delay adjustment circuit 23 is $t_4+d_4$.

Figure 7A:
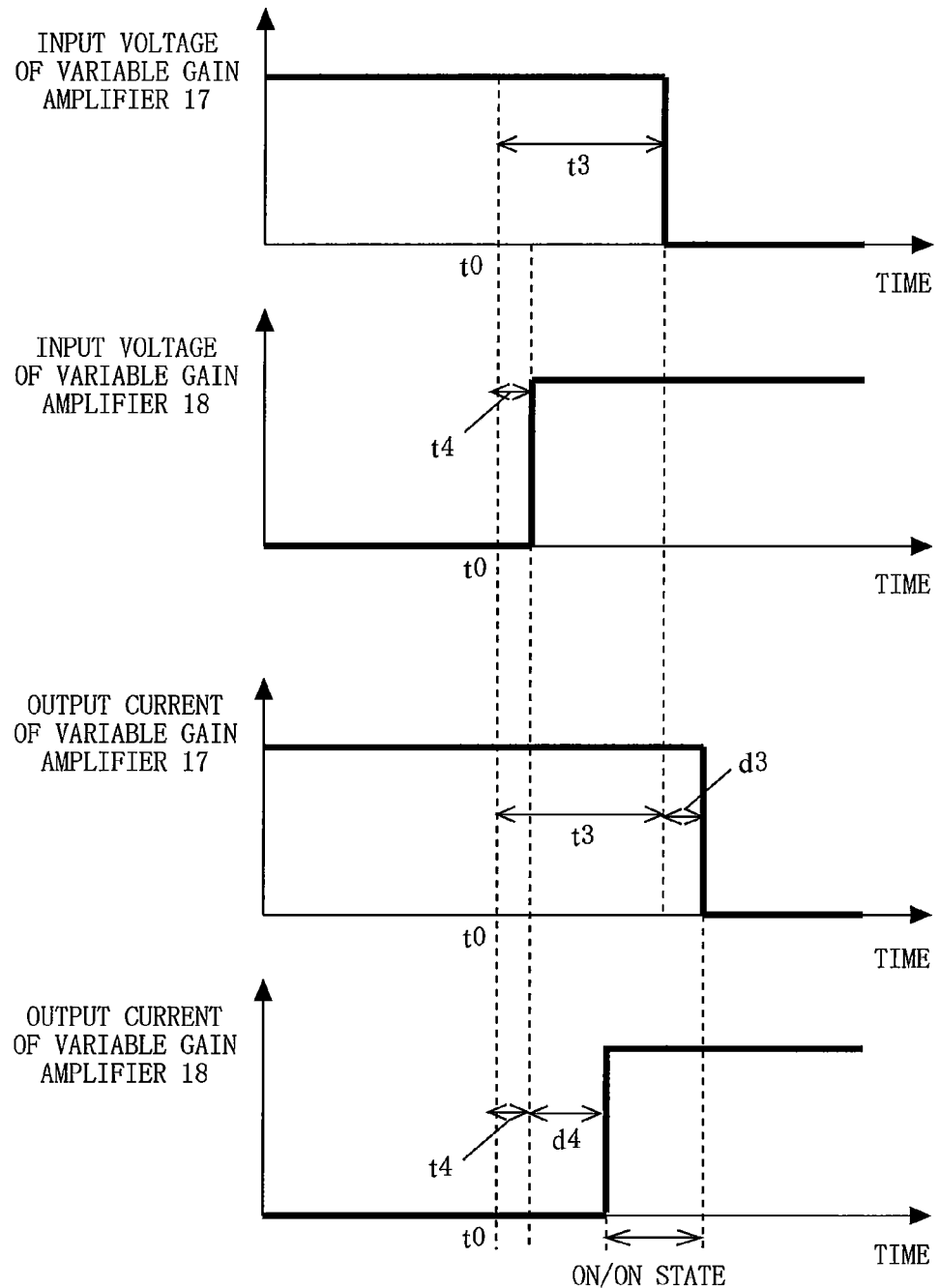
FIG. 7A is a diagram showing an example of the relationship between input voltages and output currents of the first variable gain amplifier 171 and the second variable gain amplifier 172, respectively, when switching from the first variable gain amplifier 171 to the second variable gain amplifier 172.
Figure 7B:
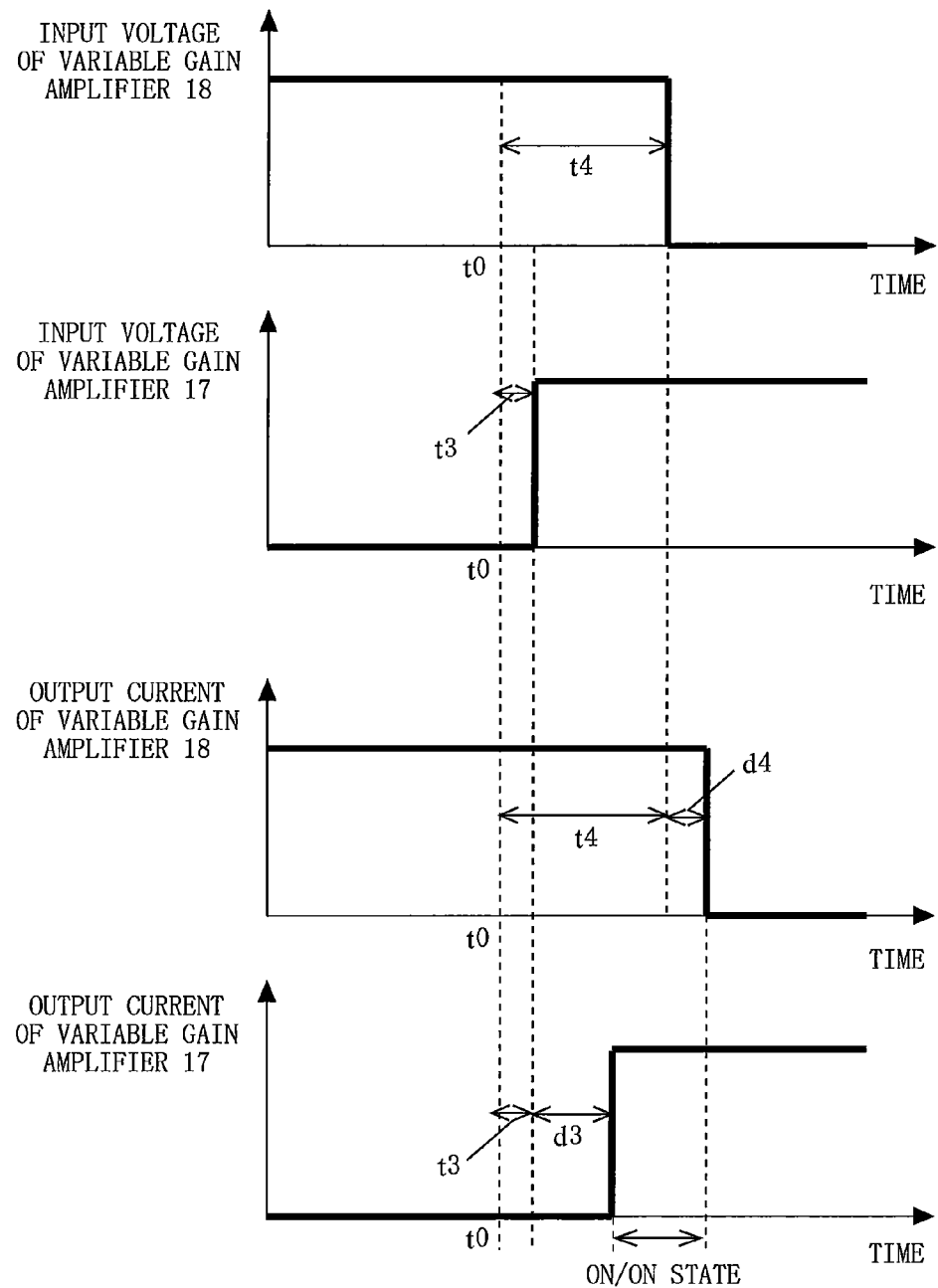
FIG. 7B is a diagram showing an example of the relationship between input voltages and output currents of the first variable gain amplifier 171 and the second variable gain amplifier 172, respectively, when switching from the second variable gain amplifier 172 to the first variable gain amplifier 171.

That is, for switching from the quadrature modulation scheme to the polar modulation scheme, a condition $t_3+d_3>t_4+d_4$ needs to be satisfied so that the base terminal of the amplifying transistor 141 is prevented from being in the no input state. The relationship between input voltages and output currents of the first variable gain amplifier 171 and the second variable gain amplifier 171 at this time is, for example, as shown in FIG. 7A. Also, on the contrary, for switching from the polar modulation scheme to the quadrature modulation scheme, a condition $t_3+d_3<t_4+d_4$ needs to be satisfied so that the base terminal of the amplifying transistor 141 is prevented from being in the no input state. The relationship between input voltages and output currents of the first variable gain amplifier 171 and the second variable gain amplifier 172 at this time is as shown in FIG. 7B, for example.

Here, the delay times $d_3$ and $d_4$ vary depending on variation of a circuit element, change in temperature, or the like. Therefore, for switching from the quadrature modulation scheme to the polar modulation scheme, the delay times $t_3$ and $t_4$ need to be set so that a condition $t_3+\min(d_3)>t_4+\max(d_4)$ is satisfied, where min($d_3$) denotes a minimal value of the delay time $d_3$ and max($d_4$) denotes a maximal value of the delay time $d_4$. On the contrary, for switching from the polar modulation scheme to the quadrature modulation scheme, the delay times $t_3$ and $t_4$ need to be set so that a condition $t_3+\max(d_3)<t_4+\min(d_4)$ is satisfied, where max($d_3$) denotes a maximal value of the delay time $d_3$ and min($d_4$) denotes a minimal value of the delay time $d_4$.

Figure 8A:
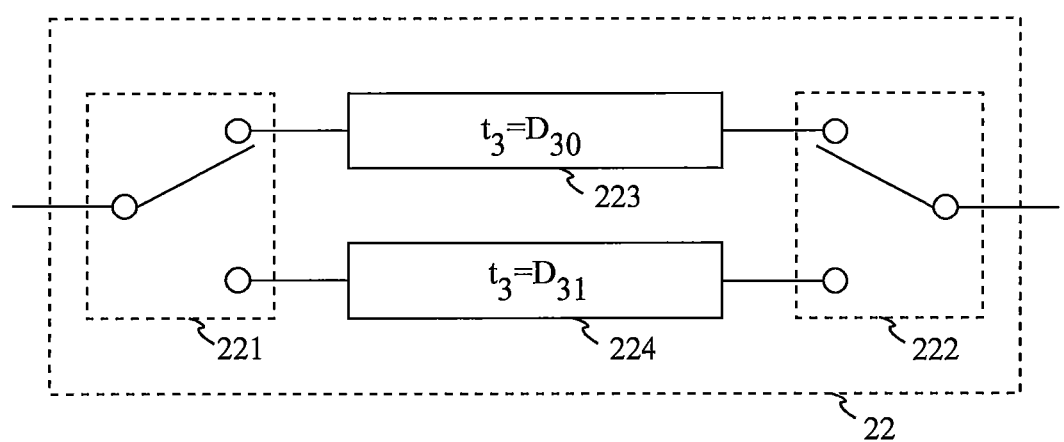
FIG. 8A is a block diagram showing an example of a configuration of a delay adjustment circuit 22.

FIG. 8A is a block diagram showing an example of a configuration of the delay adjustment circuit 22. In FIG. 8A, the delay adjustment circuit 22 is configured with a first high speed switch 221, a second high speed switch 222, a first transmission line 223, and a second transmission line 224. The first transmission line 223 is a transmission line which provides low-delay, and the delay time is $D_{30}$. On the other hand, the second transmission line 224 is a transmission line which provides large delay, and the delay time is $D_{31}$. Switching of the first high speed switch 221 and the second high speed switch 222 sets $D_{30}$ or $D_{31}$ to the delay time $t_3$.

Figure 8B:
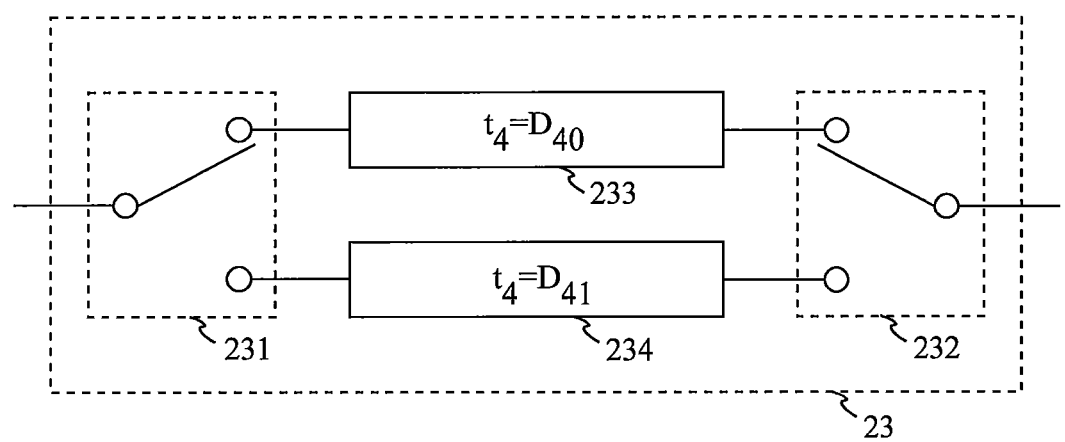
FIG. 8B is a block diagram showing an example of a configuration of the delay adjustment circuit 23.

FIG. 8B is a block diagram showing an example of a configuration of the delay adjustment circuit 23. In FIG. 8B, the delay adjustment circuit 23 is configured with a first high speed switch 231, a second high speed switch 232, a first transmission line 233, and a second transmission line 234. The first transmission line 233 is a transmission line which provides low-delay, and the delay time is $D_{40}$. On the other hand, the second transmission line 234 is a transmission line which provides large delay, and the delay time is $D_{41}$. Switching of the high speed switches 231 and 232 sets $D_{40}$ or $D_{41}$ to the delay time $t_4$.

For switching from the quadrature modulation scheme to the polar modulation scheme, the following setting is made: $t_3=D_{31}$ and $t_4=D_{40}$, and, for switching from the polar modulation scheme to the quadrature modulation scheme, the following setting is made: $t_3=D_{30}$ and $t_4=D_{41}$. $D_{31}$ satisfies $(D_{31}-D_{40})>\max(d_4)-\min(d_3)$, and $D_{41}$ satisfies $(D_{41}-D_{30})>\max(d_3)-\min(d_4)$.

After the switching, values are set to $t_3$ and $t_4$ to prepare for the subsequent switching. For example, after switching from the quadrature modulation scheme to the polar modulation scheme, the following setting is made: $t_3=D_{30}$ and $t_4=D_{41}$. On the contrary, after switching from the polar modulation scheme to the quadrature modulation scheme, the following setting is made: $t_3=D_{31}$ and $t_4=D_{40}$. By thus controlling the delay time, at least one of the first variable gain amplifier 171 and the second variable gain amplifier 172 is continuously turned on, thereby preventing the base terminal of the amplifying transistor 141 from being in the no input state.

It should be noted that if the base terminal of the amplifying transistor 141 can be prevented from being in the no input state when $t_3=0$, the transmission circuit 1 does not need to include the delay adjustment circuit 22. Likewise, if the base terminal of the amplifying transistor 141 can be prevented from being in the no input state when $t_4=0$, the transmission circuit 1 does not need to include the delay adjustment circuit 23.

Next, the operation when the bias control section 105 outputs the bias control signals DC5 and DC6 and switches a bias voltage of the power amplifier 14 will be described in detail. When instructed from the mode switching control section 102 to switch the operation mode, the bias control section 105 supplies the bias control signal DC5 for controlling the first bias circuit 15 to the delay adjustment circuit 24, and also supplies the bias control signal DC6 for controlling the second bias circuit 16 to the delay adjustment circuit 25. For example, for switching from the polar modulation scheme to the quadrature modulation scheme, the bias control section 105 outputs the bias control signal DC5 that satisfies DC5>$V_{th5}$ and the bias control signal DC6 that satisfies DC6<$V_{th6}$ to turn on the first bias circuit 15 and turn off the second bias circuit 16, respectively.

Here, the $V_{th5}$ and $V_{th6}$ are threshold values defining the on states of the bias control signals DC5 and DC6, respectively, and can be set arbitrarily. That is, the bias control signals DC5 and DC6 are signals for controlling the on/off states of the first bias circuit 15 and the second bias circuit 16, respectively, and thus, any voltage value may be used if its object can be attained. Furthermore, depending on types of the first bias circuit 15 and the second bias circuit 16, current values may be used as the bias control signals DC5 and DC6.

If the bias control signal DC5 supplied to the first bias circuit 15 via the delay adjustment circuit 24 is greater than the threshold value $V_{th5}$ which turns on the first bias circuit 15, the first bias circuit 15 supplies the bias voltage to the power amplifier 14. Likewise, if the bias control signal DC6 supplied to the second bias circuit 16 via the delay adjustment circuit 25 is greater than the threshold value $V_{th6}$ which turns on the second bias circuit 16, the second bias circuit 16 supplies the bias voltage to the power amplifier 14.

The delay adjustment circuit 24 delays the switching of the first bias circuit 15 a predetermined time $t_5$. The delay adjustment circuit 25 delays the switching of the second bias circuit 16 a predetermined time $t_6$. Specifically, the delay adjustment circuit 24 delays the bias control signal DC5 the predetermined time $t_5$. Likewise, the delay adjustment circuit 25 delays the bias control signal DC6 the predetermined time $t_6$. The predetermined times $t_5$ and $t_6$ are adjusted so that the power amplifier 14 when switching the operation mode of the transmission circuit 1 is prevented from being in the unbiased state.

Here, a delay time which occurs in the path from the bias control section 105 to the base terminal of the amplifying transistor 141 via the first bias circuit 15 is indicated by $d_5$, exclusive of the delay time $t_5$ caused by the delay adjustment circuit 24. Also, a delay time which occurs in the path from the bias control section 105 to the base terminal of the amplifying transistor 141 via the second bias circuit 16 is indicated by $d_6$, exclusive of the delay time $t_6$ caused by the delay adjustment circuit 25.

In this case, a delay time which occurs in the path from the bias control section 105 to the base terminal of the amplifying transistor 141 via the first bias circuit 15 is $t_5+d_5$, inclusive of the delay time $t_5$ caused by the delay adjustment circuit 24. Also, a delay time which occurs in the path from the bias control section 105 to the base terminal of the amplifying transistor 141 via the second bias circuit 16 is $t_6+d_6$, inclusive of the delay time $t_6$ caused by the delay adjustment circuit 25. That is, for switching from the first bias circuit 15 to the second bias circuit 16, a condition $t_5+d_5>t_6+d_6$ needs to be satisfied so that the power amplifier 14 is prevented from being in the unbiased state. The relationship between input voltages and output currents of the first bias circuit 15 and the second bias circuit 16 at this time is, for example, as shown in FIG. 9A.

Figure 9B:
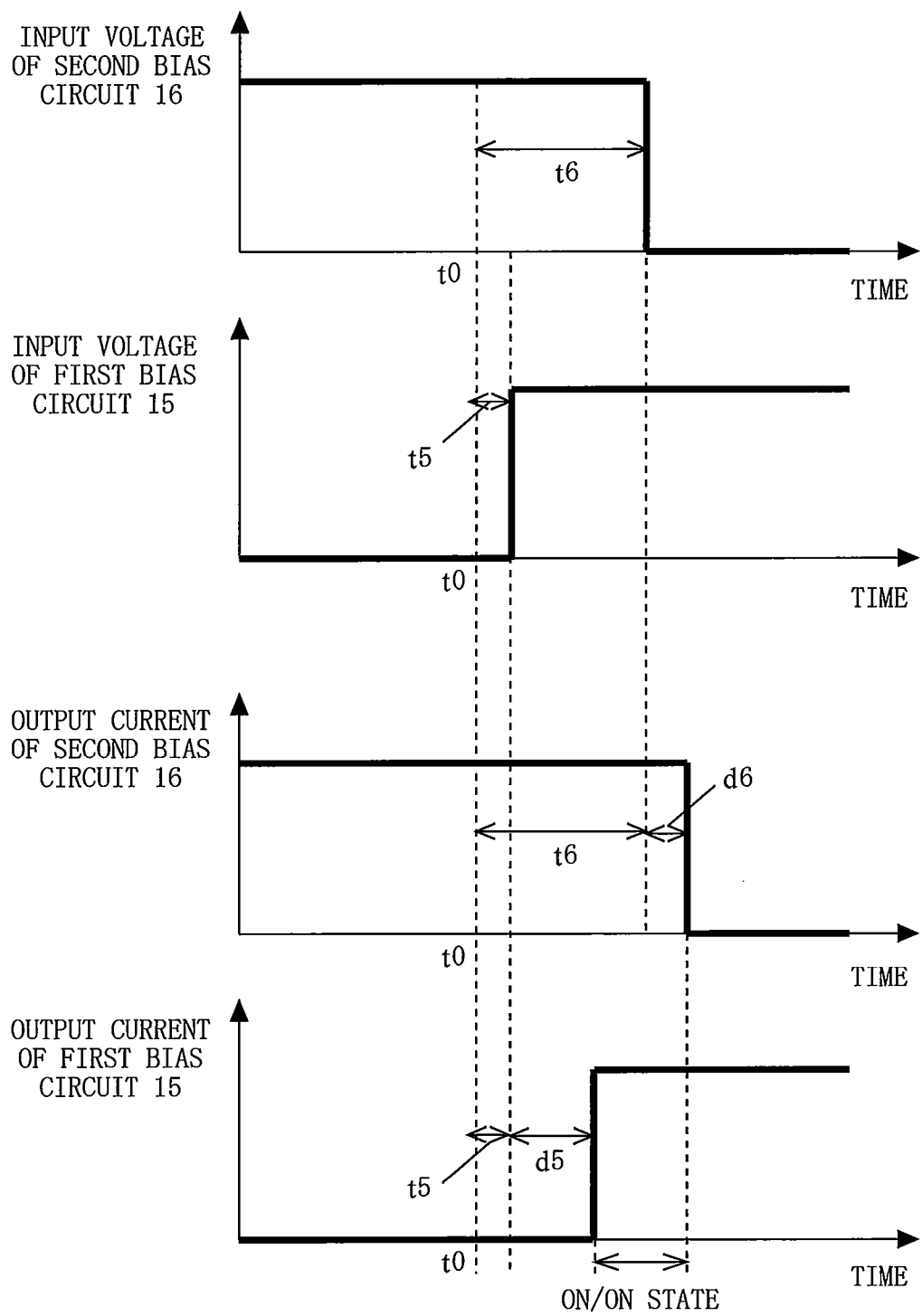
FIG. 9B is a diagram showing an example of the relationship between input voltages and output currents of the first bias circuit 15 and the second bias circuit 16, respectively, when switching from the second bias circuit 16 to the first bias circuit 15.

Also, on the contrary, for switching from the second bias circuit 16 to the first bias circuit 15, a condition $t_5+d_5<t_6+d_6$ needs to be satisfied so that the power amplifier 14 is prevented from being in the unbiased state. The relationship between input voltages and output currents of the first bias circuit 15 and the second bias circuit 16 at this time is as shown in FIG. 9B, for example.

Here, the delay times $d_5$ and $d_6$ vary depending on variation of a circuit element, change in temperature, or the like. Therefore, for switching from the first bias circuit 15 to the second bias circuit 16, the delay times $t_5$ and $t_6$ need to be set so that a condition $t_5+\min(d_5)>t_6+\max(d_6)$ is satisfied, where min ($d_5$) denotes a minimal value of the delay time $d_5$ and max ($d_6$) denotes a maximal value of the delay time $d_6$. On the contrary, for switching from the second bias circuit 16 to the first bias circuit 15, the delay times $t_5$ and $t_6$ need to be set so that a condition $t_5+\max(d_5)<t_6+\min(d_6)$ is satisfied, where max ($d_5$) denotes a maximal value of the delay time $d_5$ and min ($d_6$) denotes a minimal value of the delay time $d_6$.

Figure 10A:
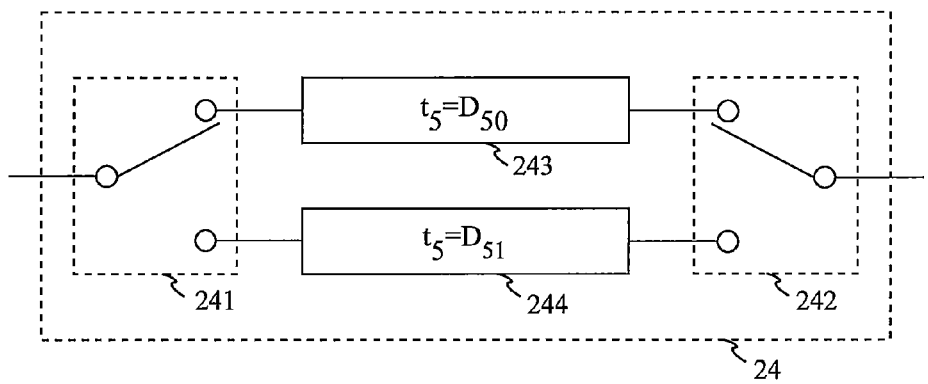
FIG. 10A is a block diagram showing an example of a configuration of a delay adjustment circuit 24.

FIG. 10A is a block diagram showing an example of a configuration of the delay adjustment circuit 24. In FIG. 10A, the delay adjustment circuit 24 is configured with a first high speed switch 241, a second high speed switch 242, a first transmission line 243, and a second transmission line 244. The first transmission line 243 is a transmission line which provides low-delay, and the delay time is $D_{50}$. On the other hand, the second transmission line 244 is a transmission line which provides large delay, and the delay time is $D_{51}$. Switching of the high speed switches 241 and 242 sets $D_{50}$ or $D_{51}$ to the delay time $t_5$.

Figure 10B:
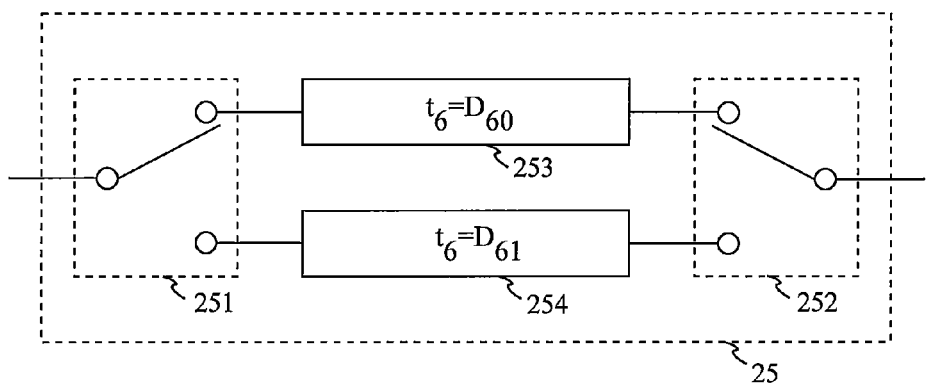
FIG. 10B is a block diagram showing an example of a configuration of a delay adjustment circuit 25.

FIG. 10B is a block diagram showing an example of a configuration of the delay adjustment circuit 25. In FIG. 10B, the delay adjustment circuit 25 is configured with a first high speed switch 251, a second high speed switch 252, a first transmission line 253, and a second transmission line 254. The first transmission line 253 is a transmission line which provides low-delay, and the delay time is $D_{20}$. On the other hand, the second transmission line 254 is a transmission line which provides large delay, and the delay time is $D_{21}$. Switching of the high speed switches 251 and 252 sets $D_{60}$ or $D_{61}$ to the delay time $t_6$.

For switching from the first bias circuit 15 to the second bias circuit 16, the following setting is made: $t_5=D_{51}$ and $t_6=D_{60}$, and for switching from the second bias circuit 16 to the first bias circuit 15, the following setting is made: $t_5=D_{50}$ and $t_6=D_{61}$. $D_{51}$ satisfies $(D_{51}-D_{60})>\max(d_6)-\min(d_5)$ and D61 satisfies $(D_{61}-D_{50})>\max(d_5)-\min(d_6)$.

After the switching of the bias circuit, values are set to $t_5$ and $t_6$ to prepare for the subsequent switching. For example, after switching from the first bias circuit 15 to the second bias circuit 16, the following setting is made: $t_5=D_{50}$ and $t_6=D_{61}$. By thus controlling the delay time, at least one of the first bias circuit 15 and the second bias circuit 16 is continuously turned on, thereby preventing the power amplifier 14 from being in the unbiased state.

It should be noted that if the power amplifier 14 can be prevented from being in the unbiased state when $t_5=0$, the transmission circuit 1 does not need to include the delay adjustment circuit 24. Likewise, if the power amplifier 14 can be prevented from being in the unbiased state when $t_6=0$, the transmission circuit 1 does not need to include the delay adjustment circuit 25.

Also, the same effect is obtained even if the delay adjustment circuit 24 is provided between an output terminal of the first bias circuit 15 and the base terminal of the amplifying transistor 141 of the power amplifier 14. Likewise, the same effect is obtained even if the delay adjustment circuit 25 is provided between an output terminal of the second bias circuit 16 and the base terminal of the amplifying transistor 141 of the power amplifier 14.

It should be noted that while the above description is given assuming that the amplifying transistor 141 included in the power amplifier 14 is a bipolar transistor, the same effect can be obtained even if the amplifying transistor 141 is a field effect transistor (FET). In addition, the power amplifier 14 may be implemented in a multi-stage configuration.

Next, operations of a loop (hereinafter, referred to as power control loop), which includes the distributer 26, the detector 27, the comparison section 106, and the gain control section 104, will be described. The power control loop operates, when switching the operation mode of the transmission circuit 1, to prevent discontinuous variation of the output power of the transmission circuit 1 (that is, the power amplifier 14). In this case, for example, the power information P is inputted to the detector 27. The detector 27 detects a timing of switching the operation mode of the transmission circuit 1, based on the power information P. It should be noted that the detector 27 may detect the timing of switching the operation mode of the transmission circuit 1, in accordance with the determination by the mode switching determination section 101. The detector 27 operates along with the timing of switching the operation mode of the transmission circuit 1, detects the output of the distributer 26, and outputs a voltage value in proportion to the output power of the distributer 26 to the comparison section 106.

The comparison section 106 compares between a detected voltage $V_{det0}$ of the detector 27, which is detected before the mode switching, and a detected voltage $V_{det1}$ of the detector 27, which is detected immediately after the mode switching, and outputs a difference $\Delta V_{det}$ therebetween to the gain control section 104. On the basis of the power information P and the difference $\Delta V_{det}$ outputted from the comparison section 106, the gain control section 104 calculates the gain G1 of the first variable gain amplifier 171, the gain G2 of the second variable gain amplifier 172, and the gain G3 of the third variable gain amplifier 173 so that the output power of the power amplifier 14 converges to a target output level. The gain control section 104 is able to calculate the gain G1, the gain G2, and the gain G3 by a predetermined calculation using the power information P and the difference $\Delta V_{det}$ outputted from the comparison section 106. Alternatively, the gain control section 104 can also calculate the gain G1, the gain G2, and the gain G3 by referring to the lookup table (LUT), provided that, in the lookup table, the power information P and optimal gains G1, G2, and G3 corresponding to the difference $\Delta V_{det}$ outputted from the comparison section 106 are previously set.

The first variable gain amplifier 171 amplifies the output signal from the amplitude phase modulation section 19 with the gain G1 outputted by the gain control section 104. The second variable gain amplifier 172 amplifies the output signal from the phase modulation section 13 with the gain G2 outputted by the gain control section 104. The third variable gain amplifier 173 amplifies the amplitude signal M with the gain G3 outputted by the gain control section 104. This allows the transmission circuit 1 to prevent the discontinuous variation of the output power when switching the operation mode. It should be noted that, if the operation mode is the quadrature modulation scheme, the operation of the third variable gain amplifier 173 is stoppable by control by the control section 11 (the bias control section 105).

Figure 11A:
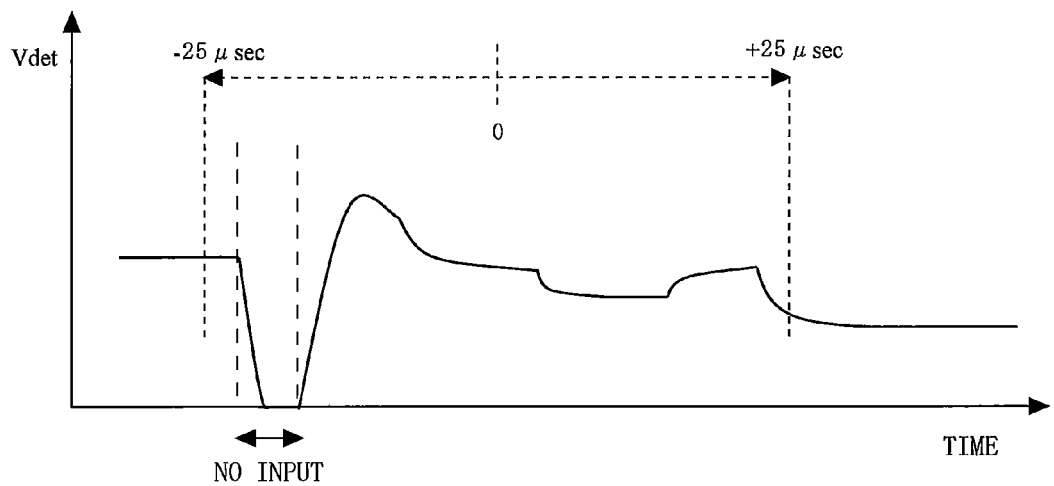
FIG. 11A is a diagram showing an example of output power transition of the transmission circuit 1 in the case where delay adjustment using the delay adjustment circuits 20 to 25 is not conducted when switching the operation mode of the transmission circuit 1.
Figure 11B:
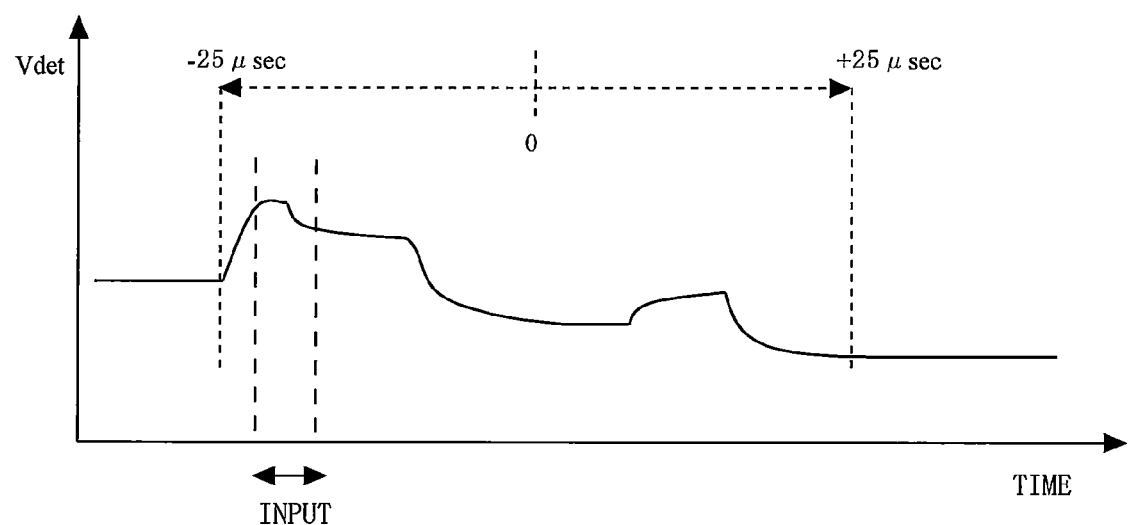
FIG. 11B is a diagram showing an example of output power transition of the transmission circuit 1 in the case where delay adjustment using the delay adjustment circuits 20 to 25 is conducted when switching the operation mode of the transmission circuit 1.

Next, the effect of the present embodiment will be described using an example of switching the operation mode of the transmission circuit 1 from the polar modulation scheme to the quadrature modulation scheme in the W-CDMA standard. FIG. 11A is a diagram showing an example of output power transition of the transmission circuit 1 in the case where delay adjustment using the delay adjustment circuits 20 to 25 is not conducted when switching the operation mode of the transmission circuit 1. FIG. 11B is a diagram showing an example of output power transition of the transmission circuit 1 in the case where delay adjustment using the delay adjustment circuits 20 to 25 is conducted when switching the operation mode of the transmission circuit 1. In FIGS. 11A and 11B, the boundary between symbols is set at 0 μsec.

As described above, in the W-CDMA standard, the output signal from the power amplifier 14 needs to be changed to a target power level within predetermined time periods before and after the symbol boundary (for example, 25 μsec). As shown in FIG. 11A, in the case where adjustment using the delay adjustment circuits 20 to 25 is not conducted, a time period, in which each of terminals of the amplifying transistor 141 falls in the no input state, occurs, and thus the output signal from the power amplifier 14 ends up being interrupted. Because of this, onset of the detector 27 detecting the output power of the power amplifier 14 delays and the output power of the power amplifier 14 can fail to converge to the target power level within the predetermined time periods before and after the symbol boundary.

On the other hand, as shown in FIG. 11B, in the case where adjustment is conducted using the delay adjustment circuits 20 to 25 so that each of the terminals of the amplifying transistor 141 is prevented from being in the no input state, the output signal from the power amplifier 14 can be prevented from being interrupted. Because of this, the detector 27 detecting the output power of the power amplifier 14 starts quickly, and possibility that the output signal from the power amplifier 14 converges to the target power level within the predetermined time periods before and after the symbol boundary increases.

It should be noted that while the transmission circuit 1 described above includes the first to third variable gain amplifiers 171 to 173, the transmission circuit 1 may include at least one of the first to third variable gain amplifiers 171 to 173. In this case, on the basis of the power information P and the difference $\Delta V_{det}$ outputted from the comparison section 106, the gain control section 104 calculates at least one gain among the gain G1 of the first variable gain amplifier 171, the gain G2 of the second variable gain amplifier 172, and the gain G3 of the third variable gain amplifier 173 so that the output power of the power amplifier 14 converges to the target output level. This also allows the transmission circuit 1 to prevent the discontinuous variation of the output power of the power amplifier 14 when switching the operation mode.

Alternatively, instead of including the first to third variable gain amplifiers 171 to 173, the transmission circuit 1 may be configured to adjust the magnitude of at least one of the I and Q signals, the phase signal θ, and the amplitude signal M which are outputted by the control section 11.

Figure 12A:
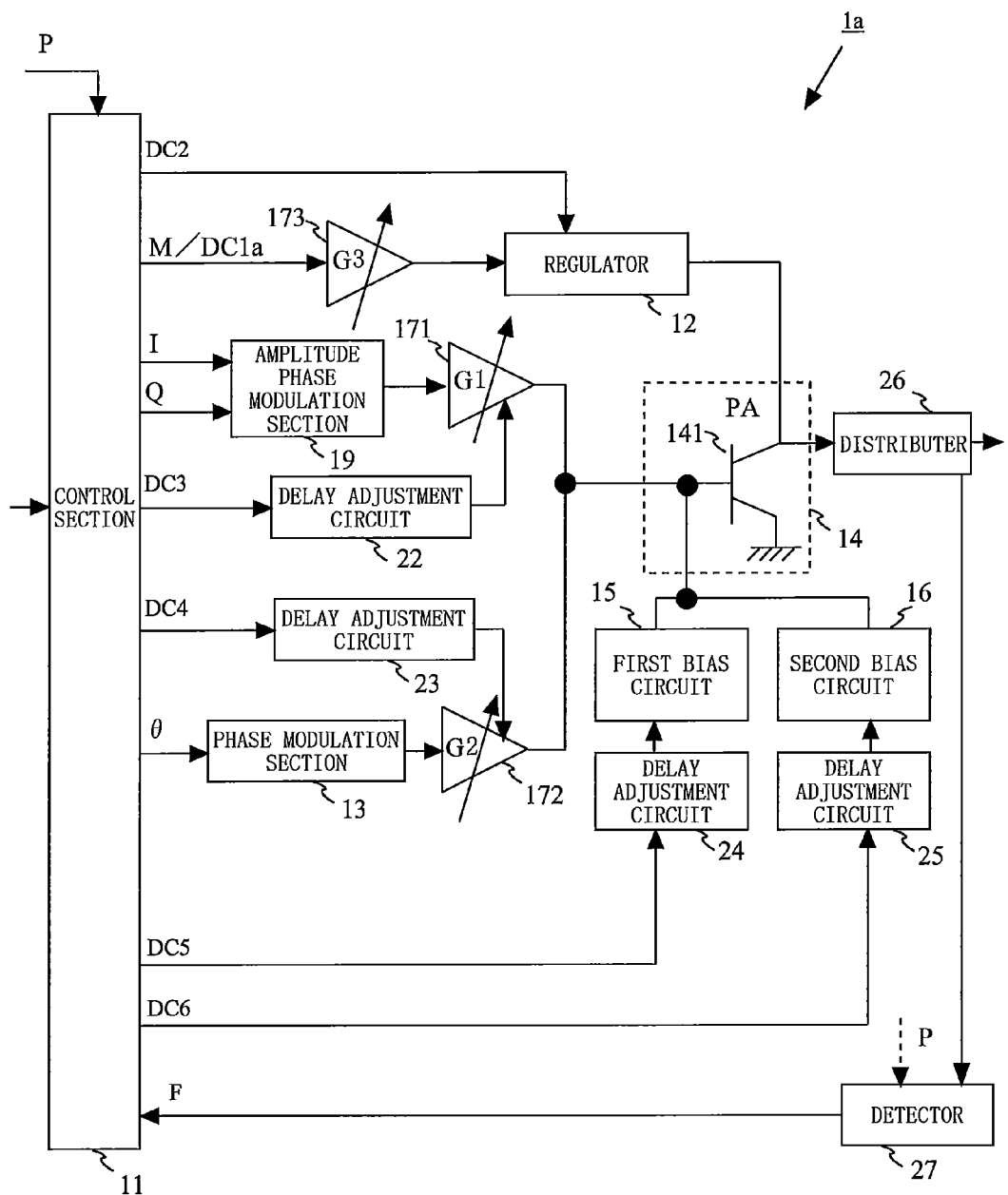
FIG. 12A is a block diagram showing an example of a configuration of a transmission circuit 1a according to the first embodiment of the present invention.

Alternatively, the transmission circuit 1 may be, like the transmission circuit 1a shown in FIG. 12A, configured in which the regulator 12 supplies the power amplifier 14 with the voltage in accordance with the amplitude signal M or the direct-current voltage, in accordance with the operation mode of the transmission circuit 1a. In this case, the amplitude signal M or a direct-current voltage control signal DC1a is inputted from the control section 11 to the regulator 12, in accordance with the operation mode of the transmission circuit 1a. The regulator 12 supplies the power amplifier 14 with a voltage in accordance with the inputted amplitude signal M or the direct-current voltage in accordance with the direct-current voltage control signal DC1a.

Figure 12B:
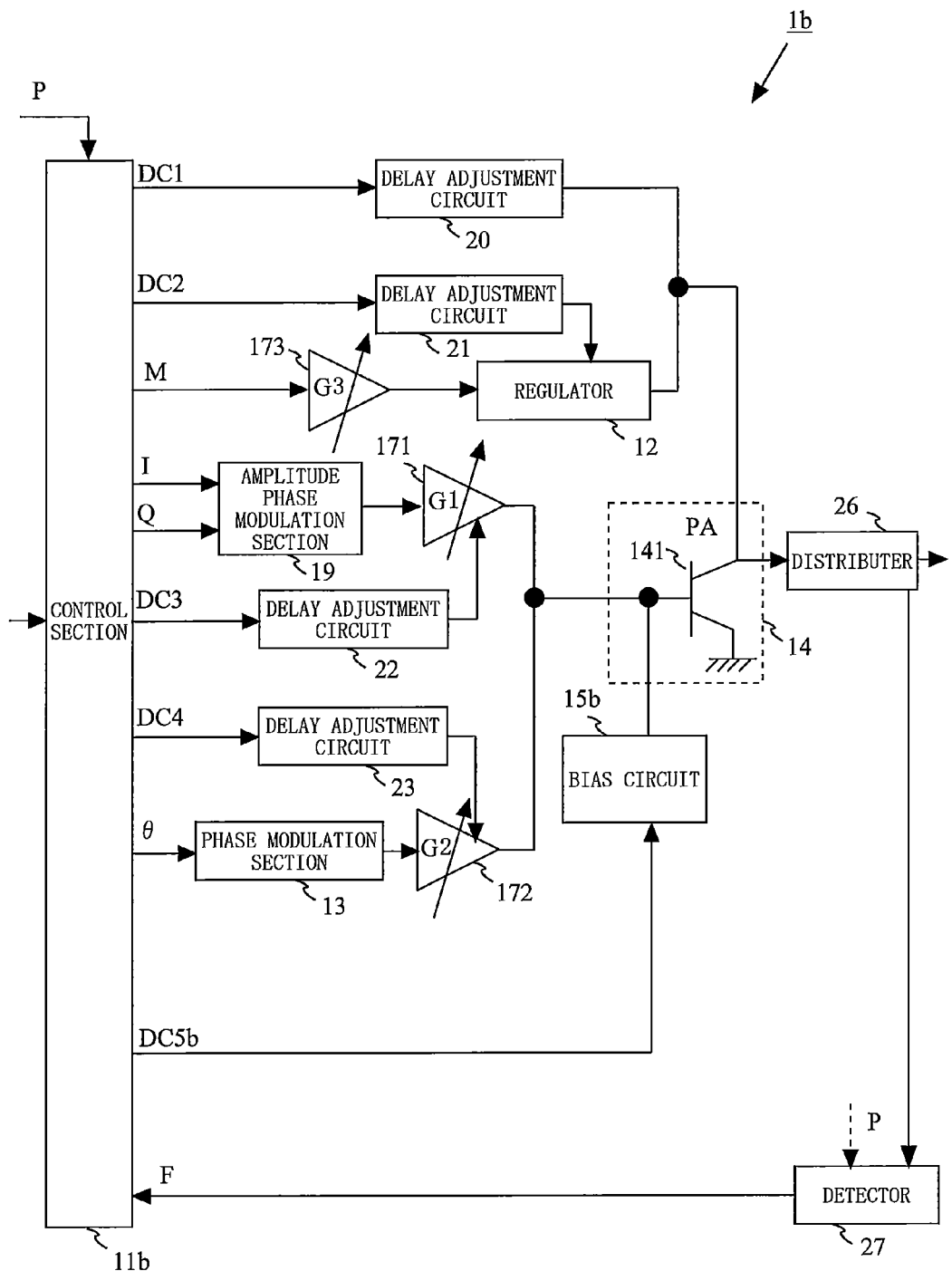
FIG. 12B is a block diagram showing an example of a configuration of a transmission circuit 1b according to the first embodiment of the present invention.

Alternatively, the transmission circuit 1 may be, like the transmission circuit 1b shown in FIG. 12B, configured in which the bias circuit is not switched in accordance with the operation mode of the transmission circuit 1b. In this case, the control section 11b outputs a bias control signal DC5b which drives a bias circuit 15b. The power amplifier 14 is supplied with a bias voltage by the bias circuit 15b, regardless of the operation mode of the transmission circuit 1b.

Figure 12C:
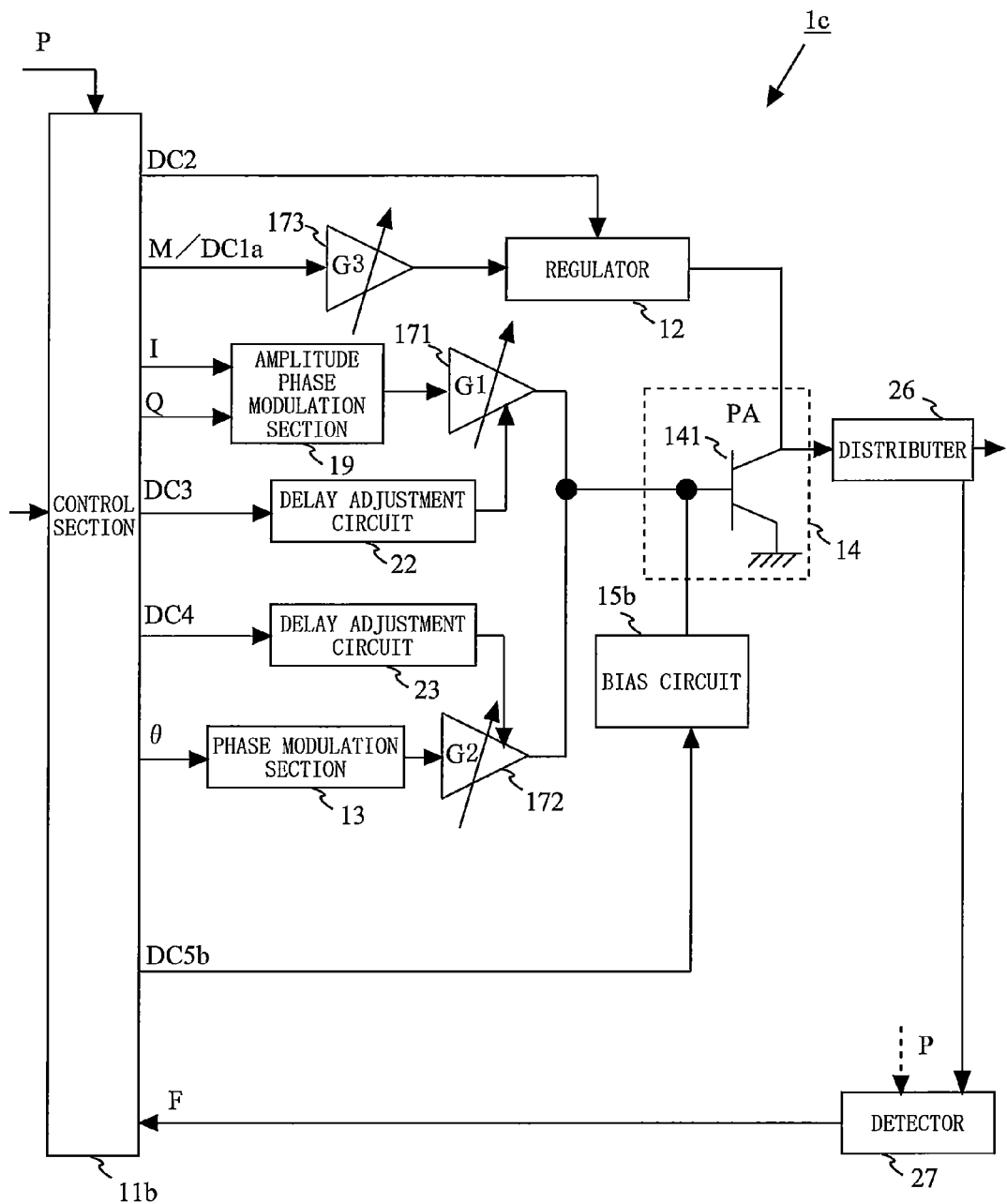
FIG. 12C is a block diagram showing an example of a configuration of a transmission circuit 1c according to the first embodiment of the present invention.

Alternatively, the transmission circuit 1 may be, like a transmission circuit 1c shown in FIG. 12C, configured with a combination of the transmission circuit 1a shown in FIG. 12A and the transmission circuit 1b shown in FIG. 12B. In FIG. 12C, the regulator 12 supplies the power amplifier 14 with the voltage in accordance with the amplitude signal M or the direct-current voltage, in accordance with the operation mode of the transmission circuit 1c. The power amplifier 14 is supplied with the bias voltage by the bias circuit 15b, regardless of the operation mode of the transmission circuit 1c.

Figure 13:
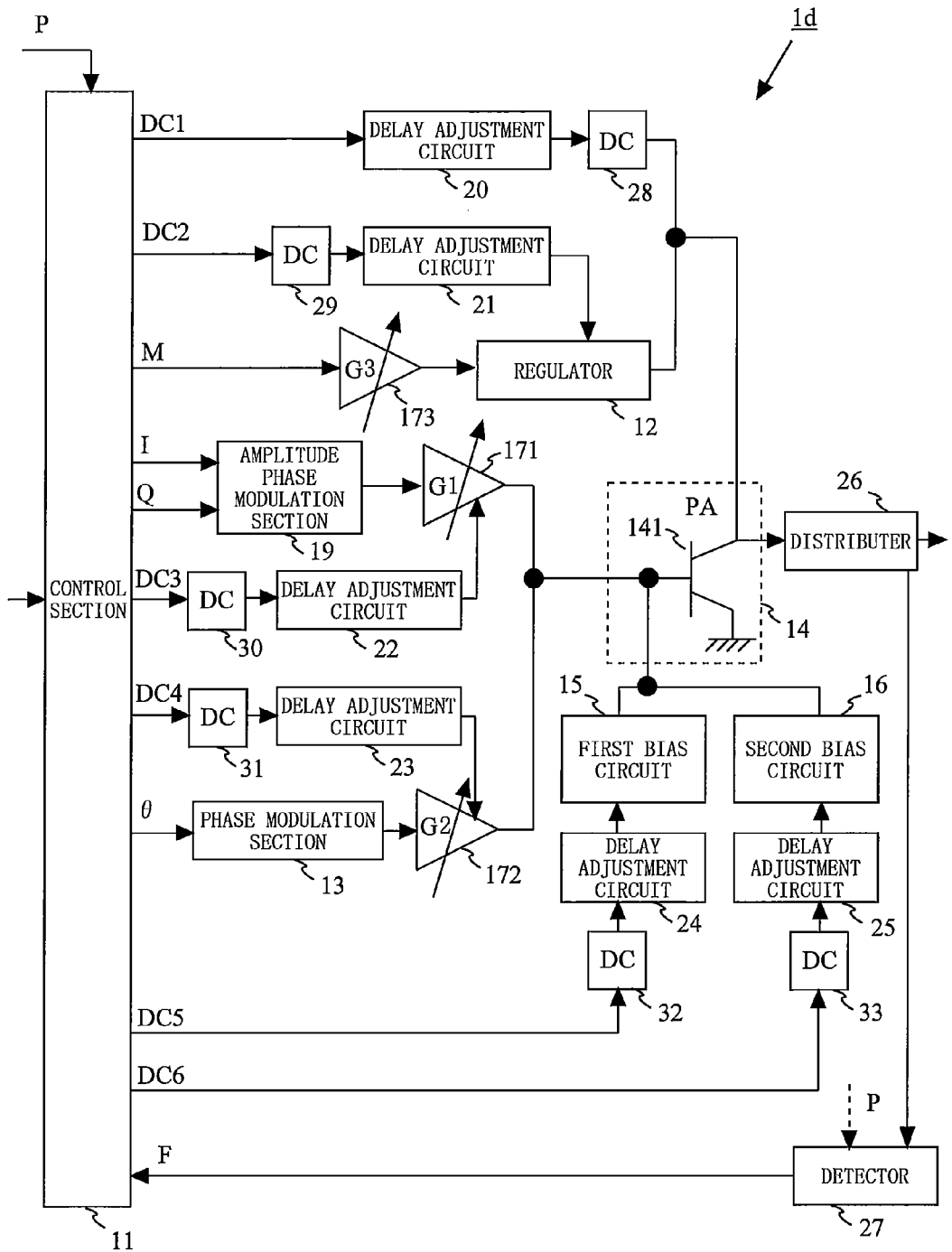
FIG. 13 is a block diagram showing an example of a configuration of a transmission circuit 1d according to the first embodiment of the present invention.

Alternatively, while, in the above-described transmission circuit 1, the control section 11 outputs the bias control signals DC1 to DC6 to supply the voltages to the power amplifier 14, the regulator 12, the first variable gain amplifier 171, the second variable gain amplifier 172, the first bias circuit 15, the second bias circuit 16, and the like, the control section 11 may, like the transmission circuit 1d shown in FIG. 13, further include the DC power supply generation sections 28, 29, 30, 31, 32, and 33.

FIG. 13 is a block diagram showing an example of a configuration of the transmission circuit 1d which includes the DC power supply generation sections 28 to 33. In FIG. 13, the DC power supply generation section 28 supplies a direct-current voltage to the collector terminal of the amplifying transistor 141, in accordance with the bias control signal DC1. The DC power supply generation section 29 supplies a direct-current voltage to the regulator 12, in accordance with the bias control signal DC2. The DC power supply generation section 30 supplies a direct-current voltage to the first variable gain amplifier 171, in accordance with the bias control signal DC3. The DC power supply generation section 31 supplies a direct-current voltage to the second variable gain amplifier 172, in accordance with the bias control signal DC4. The DC power supply generation section 32 supplies a direct-current voltage to the first bias circuit 15, in accordance with the bias control signal DC5. The DC power supply generation section 33 supplies a direct-current voltage to the second bias circuit 16, in accordance with the bias control signal DC6.

Figure 14:
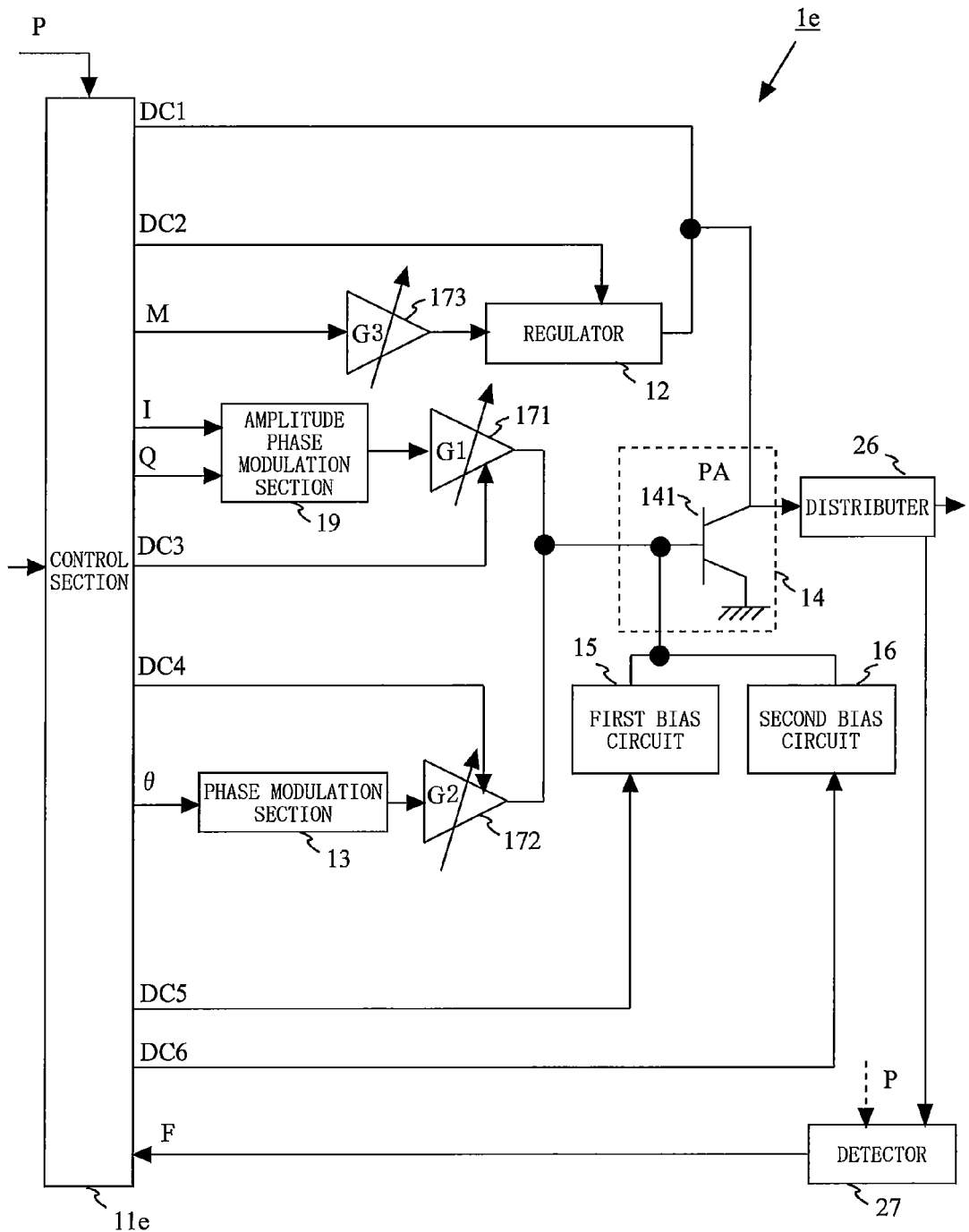
FIG. 14 is a block diagram showing an example of a configuration of a transmission circuit 1e according to the first embodiment of the present invention.

Alternatively, while the above described transmission circuits 1, 1a, 1b, 1c, and 1d include the delay adjustment circuits 20 to 25, the control section 11e may include functionality corresponding to the delay adjustment circuits 20 to 25, instead of including the delay adjustment circuits 20 to 25 like in the transmission circuit 1e shown in FIG. 14. In this case, the control section 11e adjusts a timing when to output the bias control signals DC1 to DC6, and adjusts the switching timing between the quadrature modulation scheme and the polar modulation scheme.

Figure 15:
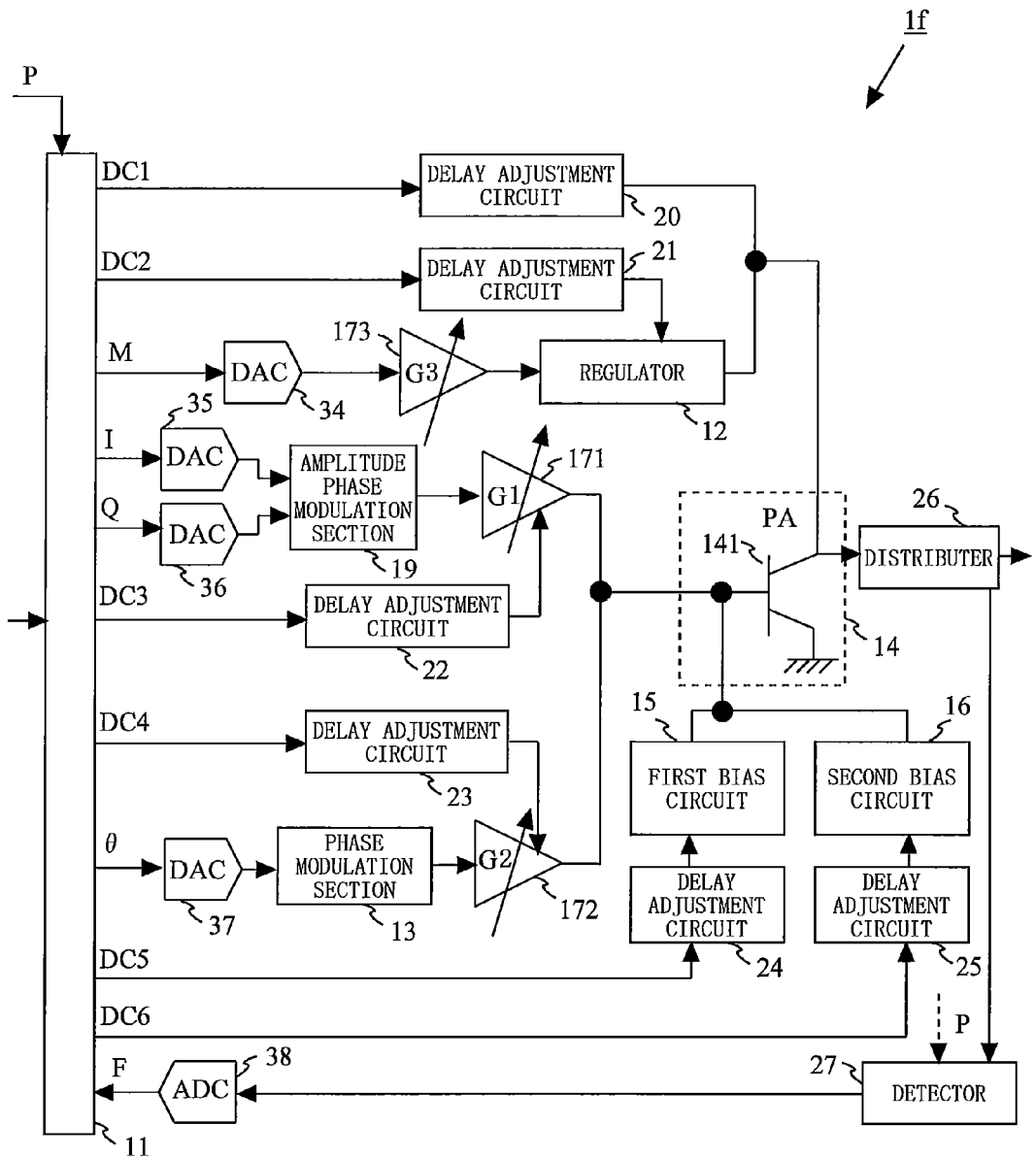
FIG. 15 is a block diagram showing an example of a configuration of a transmission circuit 1f according to the first embodiment of the present invention.

Alternatively, the above described transmission circuits 1, 1a, 1b, 1c, 1d, and 1e may further include a DAC (digital-to-analog converter) and an ADC (analog-to-digital converter), depending on whether the control section 11, the third variable gain amplifier 173, the phase modulation section 13, the amplitude phase modulation section 19, the detector 27, and the like are configured with digital components or analog components. For example, as shown in FIG. 15, a transmission circuit 1f includes DACs 34, 35, 36, and 37 if the control section 11 is configured with digital components, and the third variable gain amplifier 173, the phase modulation section 13, and the amplitude phase modulation section 19 are configured with analog components. Also, as shown in FIG. 15, the transmission circuit 1f includes an ADC 38 if the control section 11 is configured with digital components and the detector 27 is configured with analog components.

Alternatively, while the above described transmission circuit 1f includes the DAC 34 to 37 independent of each other, the DACs 34 to 37 may be used in a shared manner. For example, like in a transmission circuit 1g shown in FIG. 16A, the DAC 34 and the DAC 35 may be used in a shared manner. Likewise, the DAC 36 and the DAC 37 may be used in a shared manner. This allows reduction in number of DACs used in the transmission circuit 1g. It should be noted that the description of the delay adjustment circuits 21 to 25 is omitted for ease of description in the transmission circuit 1g shown in FIG. 16A. It should be noted that, in the transmission circuit 1g, instead of including the delay adjustment circuits 21 to 25, the control section 11 may include functionality corresponding to the delay adjustment circuits 20 to 25. Likewise, the transmission circuit 1g may include the DC power supply generation sections 28 to 33.

Figure 16A:
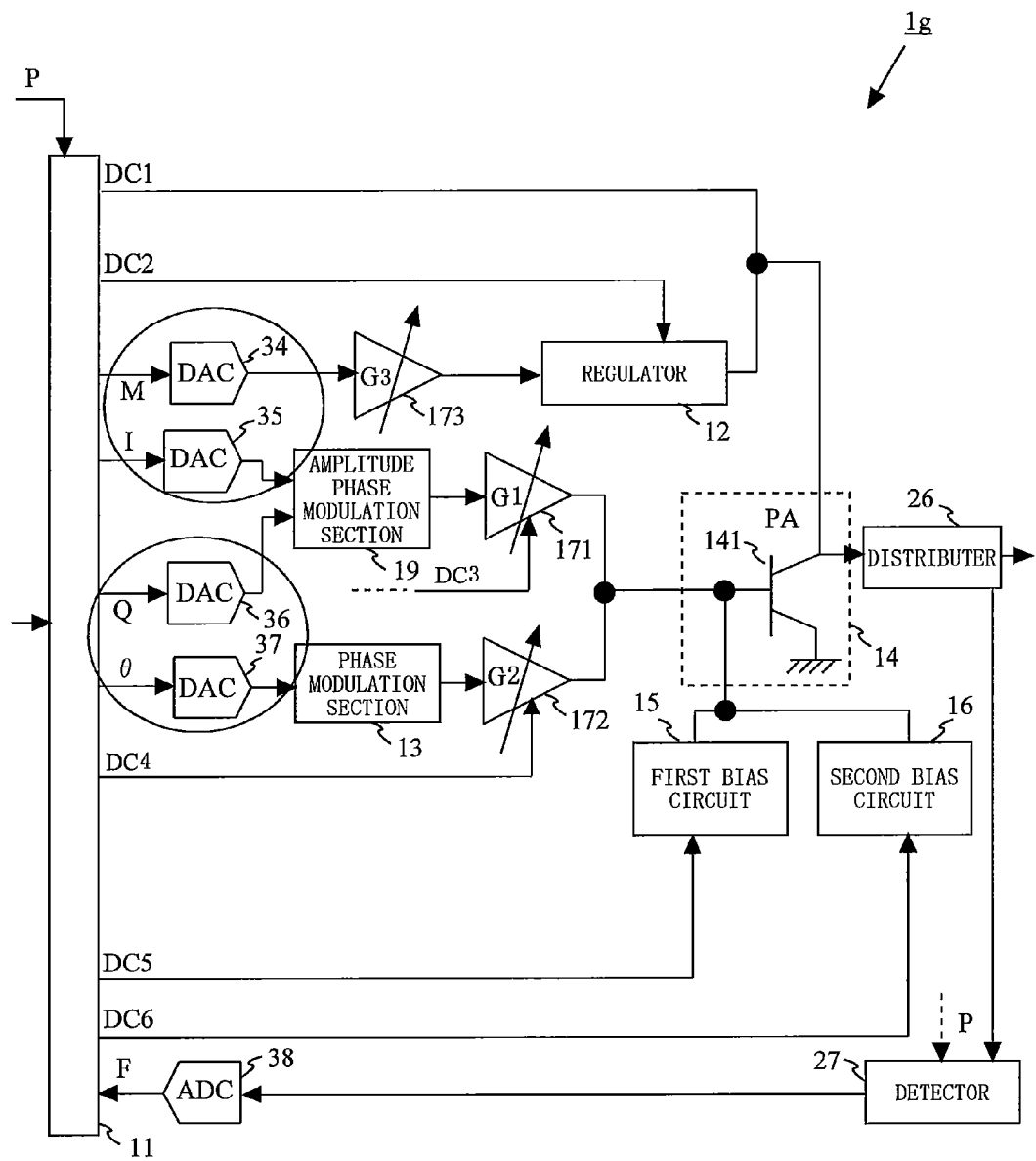
FIG. 16A is a block diagram showing an example of a configuration of a transmission circuit 1g according to the first embodiment of the present invention.
Figure 16B:
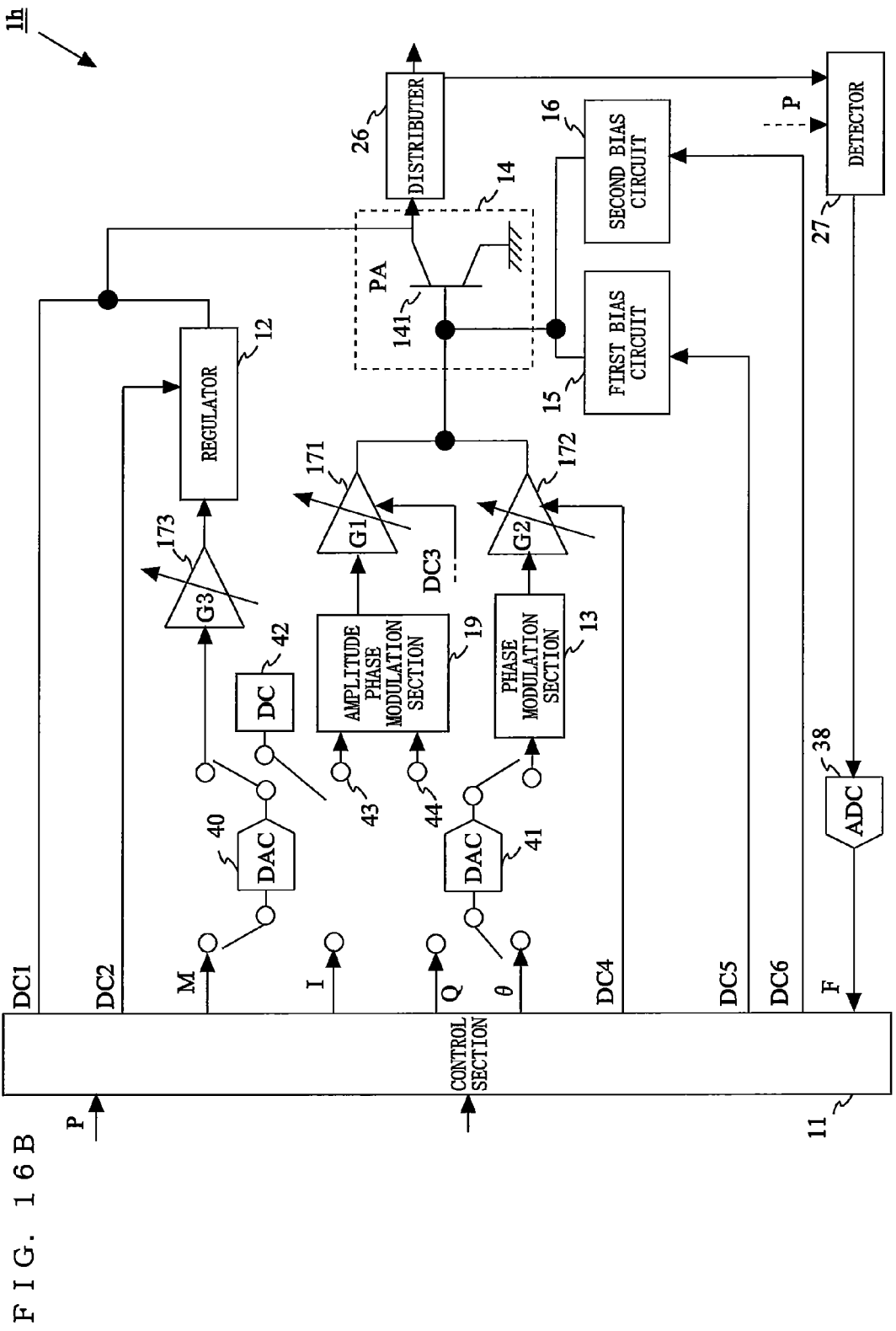
FIG. 16B is a block diagram showing an example of a configuration of a transmission circuit 1h according to the first embodiment of the present invention.

In the transmission circuit 1g shown in FIG. 16A, however, in the case where the DAC 34 and the DAC 35 are used in a shared manner and the DAC 36 and the DAC 37 are used in a shared manner, an input to the collector terminal of the amplifying transistor 141 and an input to the base terminal of the amplifying transistor 141 can fall in the no input state when switching the operation mode of the transmission circuit 1g. To prevent this, the above described transmission circuit 1g may, like a transmission circuit 1h shown in FIG. 16B, further include a DC power supply generation section 42. In FIG. 16B, the DAC 40 is the DAC 34 and the DAC 35 used in a shared manner. The DAC 41 is the DAC 36 and the DAC 37 used in a shared manner.

In FIG. 16B, when switching the operation mode of the transmission circuit 1h from the quadrature modulation scheme to the polar modulation scheme, the connection of the DAC 40 is switched so that the amplitude signal M is inputted to the regulator 12, and the connection of the DAC 41 is switched so that the phase signal θ is inputted to the phase modulation section 13. In addition, at the same time when the connections of the DAC 40 and 41 are switched, the DC power supply generation section 42 is connected to an I terminal 43 of the amplitude phase modulation section 19 for a predetermined time so that the input to the base terminal of the amplifying transistor 141 is prevented from being in the no input state, and supplies the direct-current voltage to the I terminal 43. It should be noted that the DC power supply generation section 42 may be connected to a Q terminal 44 of the amplitude phase modulation section 19 for a predetermined time, and supply the direct-current voltage to the Q terminal 44.

On the contrary, when switching the operation mode of the transmission circuit 1h from the polar modulation scheme to the quadrature modulation scheme, the connection of the DAC 40 is switched so that the I signal is inputted to the amplitude phase modulation section 19, and the connection of the DAC 41 is switched so that the Q signal is inputted to the amplitude phase modulation section 19. In addition, at the same time when the connections of the DAC 40 and 41 are switched, the DC power supply generation section 42 is connected to the third variable gain amplifier 173 for a predetermined time so that the input to the collector terminal of the amplifying transistor 141 is prevented from being in the no input state, and supplies the direct-current voltage. The switching of these connections is performed by control by the control section 11.

That is, when switching the operation mode, the DC power supply generation section 42 is connected to the I terminal 43 (or the Q terminal 44) of the amplitude phase modulation section 19 or the regulator 12 and supplies the direct-current voltage so that the input to the collector terminal of the amplifying transistor 141 and the input to the base terminal of the amplifying transistor 141 are prevented from being in the no input state. This allows the transmission circuit 1g to prevent, when switching the operation mode, the input to the collector terminal of the amplifying transistor 141 and the input to the base terminal of the amplifying transistor 141 from being in the no input state.

As described above, the transmission circuits according to the first embodiment of the present invention each adjust the timing of switching the voltage to be supplied to the collector terminal of the amplifying transistor 141 when switching the operation mode, thereby preventing the collector terminal of the amplifying transistor 141 from being in the no input state. Also, the transmission circuits each adjust the switching timing between the first variable gain amplifier 171 and the second variable gain amplifier 172, thereby preventing the base terminal of the amplifying transistor 141 from being in the no input state. Moreover, the transmission circuits each adjust the switching timing between the first bias circuit 15 and the second bias circuit 16 when switching the operation mode, thereby preventing the power amplifier 14 from being in the unbiased state. This allows the transmission circuits to prevent the interruption of the output signal from the power amplifier 14 when switching the operation mode, and allows the operation mode to be smoothly switched.

Also, since, in each of the transmission circuits, the output signal from the power amplifier 14, which is a feedback signal, is not interrupted when switching the operation mode, the detector 27 is able to quickly detect the variation of the output power of the power amplifier 14. This allows the transmission circuit 1 to inhibit in a short time the discontinuous variation of the output power along with the switching of the operation mode.

It should be noted that, while, in the present embodiment, the case where the control section 11 controls the switching of the operation mode of the transmission circuit 1 to the quadrature modulation scheme or the polar modulation scheme is described, the effect of the present invention can be obtained even if the operation modes to be switched therebetween are other than the quadrature modulation scheme and the polar modulation scheme. That is, in the case where at least one of the signal to be inputted to the first input terminal and the signal to be inputted to the second input terminal, of the power amplifier 14, is switched in accordance with the switching of the operation mode, the first input terminal and the second input terminal of the power amplifier 14 are prevented from being in the no input state by controlling the delay adjustment circuits in the paths where the switching occurs, in the manner described above. Therefore, the same effect can be obtained.

Second Embodiment

Figure 17:
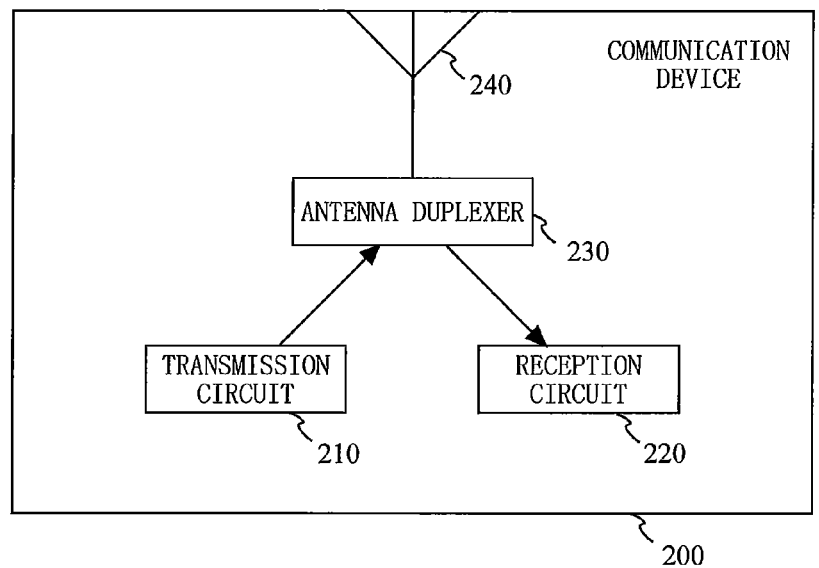
FIG. 17 is a block diagram showing an example of a configuration of a communication device 200 according to a second embodiment of the present invention.
Figure 18:
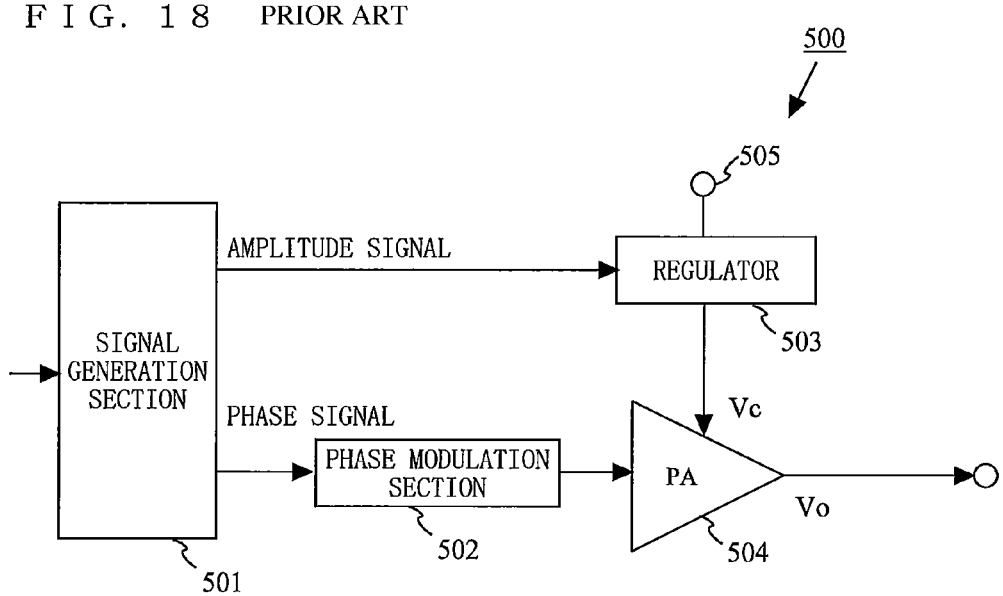
FIG. 18 is a block diagram showing an example of a configuration of a conventional transmission circuit 500.
Figure 19:
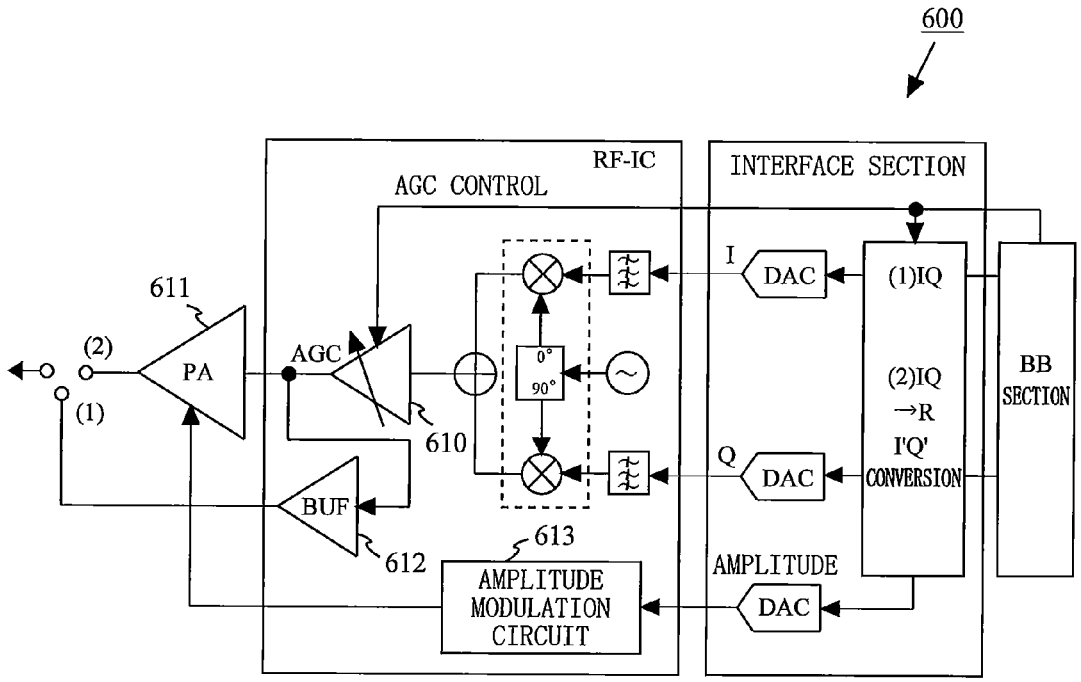
FIG. 19 is a block diagram showing an example of a configuration of a conventional transmission circuit 600.
Figure 20:
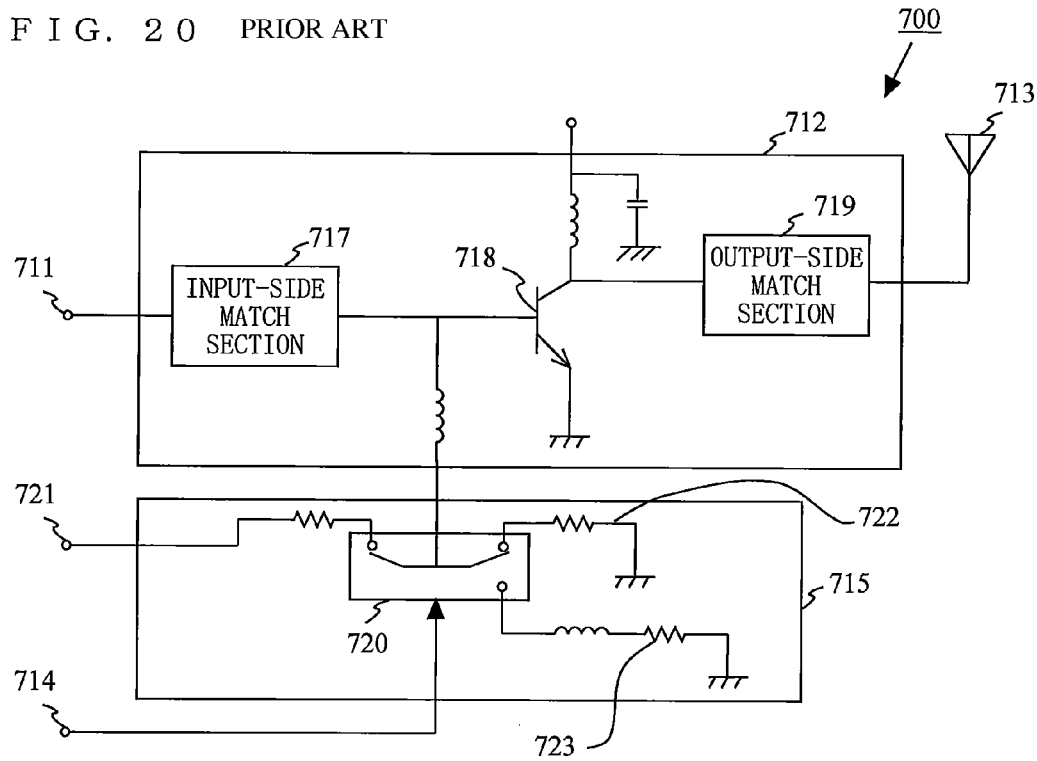
FIG. 20 is a block diagram showing an example of a configuration of a conventional transmission circuit 700.
Figure 21:
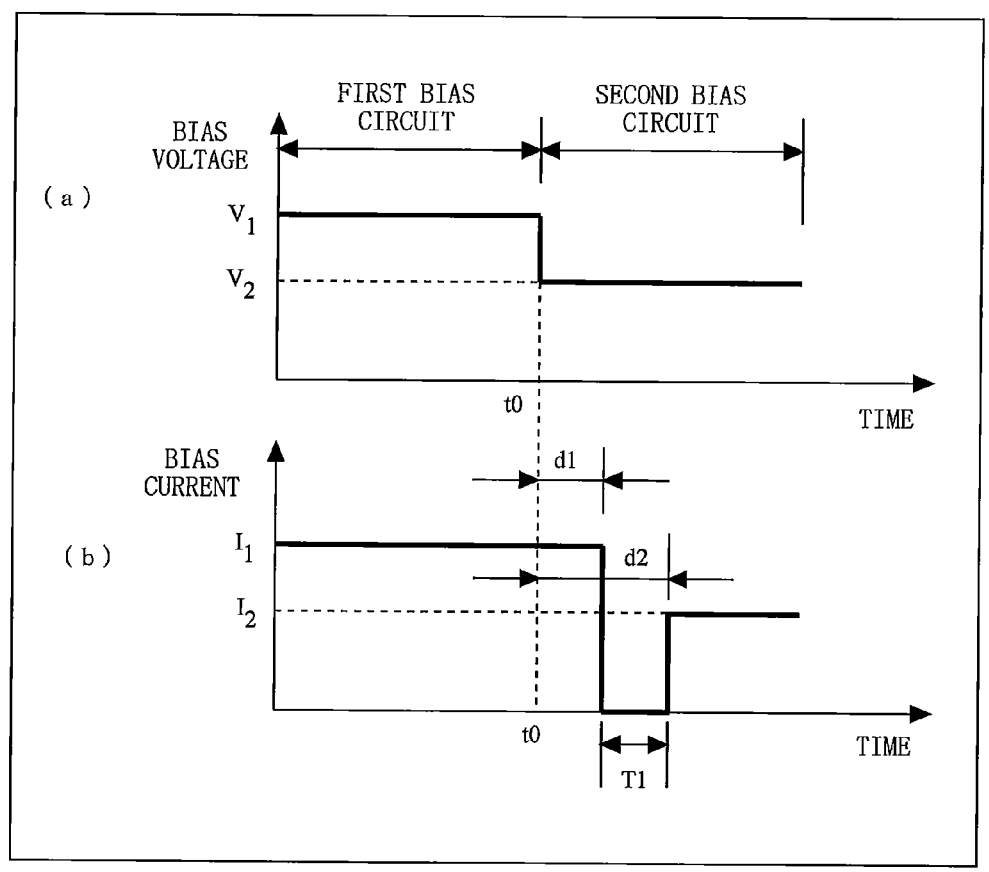
FIG. 21 is a diagram showing switch operations when switching a conventional bias circuit.

FIG. 17 is a block diagram showing an example of a configuration of a communication device 200 according to a second embodiment of the present invention. Referring to FIG. 17, the communication device 200 according to the second embodiment includes a transmission circuit 210, a reception circuit 220, an antenna duplexer 230, and an antenna 240. The transmission circuit 210 is any of the transmission circuits of the first embodiment described above. The antenna duplexer 230 transfers a transmission signal, which is outputted from the transmission circuit 210, to the antenna 240, and prevents leakage of the transmission signal to the reception circuit 220. The antenna duplexer 230 also transfers a reception signal, which is inputted thereto from the antenna 240, to the reception circuit 220, and prevents leakage of the reception signal to the transmission circuit 210.

Therefore, the transmission signal is outputted from the transmission circuit 210 and emitted from the antenna 240 to the space via the antenna duplexer 230. The reception signal is received by the antenna 240, and received by the reception circuit 220 via the antenna duplexer 230. By employing any of the transmission circuits according to the first embodiment, the communication device 200 according to the second embodiment is able to achieve, as a wireless device, low distortion while securing the linearity of the transmission signal. In addition, since there is no branching component, such as a directional coupler, for an output from the transmission circuit 210, the loss from the transmission circuit 210 to the antenna 240 can be reduced, thereby reducing the power consumption upon transmission and enabling the usage of the communication device 200 as a wireless communication device for extended period of time. The communication device 200 may include the transmission circuit 210 and the antenna 240 only.

INDUSTRIAL APPLICABILITY

A transmission circuit according to the present invention is applicable to communication devices such as mobile phones, wireless LAN devices, and the like.

DESCRIPTION OF THE REFERENCE CHARACTERS 1 transmission circuit
11 control section
12 regulator
13 phase modulation section
14 power amplifier
15, 16 bias circuit
171, 172, 173 variable gain amplifier
19 amplitude phase modulation section
20, 21, 22, 23, 24, 25 delay adjustment circuit
26 distributer
27 detector
28, 29, 30, 31, 32, 33, 42 DC power supply generation section
34, 35, 36, 37, 40, 41 DAC
38 ADC
101 mode switching determination section
102 mode switching control section
103 signal generation section
104 gain control section
105 bias control section
106 comparison section
121 switching regulator
122 series regulator
141 amplifying transistor
201, 211, 221, 231 first high speed switch
202, 212, 222, 232 second high speed switch
203, 213, 223, 233 first transmission line
204, 214, 224, 234 second transmission line
200 communication device
210 transmission circuit
220 reception circuit
230 antenna duplexer
240 antenna
500, 600, 700 transmission circuit
501 signal generation section
502 phase modulation section
503 regulator

504, 611 power amplifier
610 AGC amplifier
612 buffer
613 amplitude modulation circuit
711 RF input terminal
712 power amplifier
713 antenna
714 control signal input terminal
715 changeover control circuit
717 input-side match section
718 amplifying transistor
719 output-side match section
720 bias switch
721 power supply terminal
722 first bias circuit
723 second bias circuit

The invention claimed is:

1. A transmission circuit for outputting a transmission signal, comprising:
   a control section for determining whether to switch an operation mode of the transmission circuit to a quadrature modulation scheme or a polar modulation scheme, based on power information, and outputting a vector signal which includes I and Q signals when the operation mode of the transmission circuit is the quadrature modulation scheme, and outputting an amplitude signal and a phase signal when the operation mode of the transmission circuit is the polar modulation scheme;
   an amplitude phase modulation section for amplitude-phase modulating the vector signal outputted by the control section;
   a first variable gain amplifier for amplifying an output signal from the amplitude phase modulation section with a first gain;
   a regulator for outputting a voltage in accordance with the amplitude signal outputted by the control section;
   a phase modulation section for phase-modulating the phase signal outputted by the control section;
   a second variable gain amplifier for amplifying an output signal from the phase modulation section with a second gain;
   a power amplifier for receiving a predetermined direct-current voltage supplied thereto and amplifying an output signal from the first variable gain amplifier using the supplied predetermined direct-current voltage when the operation mode of the transmission circuit is the quadrature modulation scheme, and for receiving the voltage in accordance with the amplitude signal supplied thereto by the regulator and amplifying an output signal from the second variable gain amplifier using the supplied voltage when the operation mode of the transmission circuit is the polar modulation scheme; and
   a bias circuit for outputting a bias control signal to the power amplifier, wherein
   the power amplifier comprises: a first input terminal to which the direct-current voltage or the voltage in accordance with the amplitude signal is supplied; a second input terminal to which the output signal from the first variable gain amplifier or the output signal from the second variable gain amplifier is inputted; and a third input terminal to which the bias control signal is inputted, and
   the control section controls switching of the operation mode of the transmission circuit so that at least one of the first input terminal and the second input terminal is prevented from being in a no input state.

2. The transmission circuit according to claim 1, wherein the bias circuit is configured of;
   a first bias circuit for outputting a first bias control signal to the power amplifier when the operation mode of the transmission circuit is the quadrature modulation scheme; and
   a second bias circuit for outputting a second bias control to the power amplifier when the operation mode of the transmission circuit is the polar modulation scheme, wherein
   the control section controls the switching of the operation mode of the transmission circuit so that at least one of the first input terminal, the second input terminal, and the third input terminal is prevented from being in the no input state.

3. The transmission circuit according to claim 1, wherein the regulator supplies the power amplifier with the predetermined direct-current voltage when the operation mode of the transmission circuit is the quadrature modulation scheme, and supplies the power amplifier with the voltage in accordance with the amplitude signal outputted by the control section when the operation mode of the transmission circuit is the polar modulation scheme.

4. The transmission circuit according to claim 1, further comprising a third variable gain amplifier for amplifying, with a third gain, the amplitude signal outputted by the control section.

5. The transmission circuit according to claim 1, wherein the transmission circuit further comprises:
   a first delay adjustment circuit for delaying switching of the direct-current voltage to be supplied to the power amplifier a first delay time; and
   a second delay adjustment circuit for delaying switching of the direct-current voltage supplied to drive the regulator a second delay time, wherein
   the control section adjusts the first delay time and the second delay time so that one of the direct-current voltage and the voltage in accordance with the amplitude signal is surely supplied to the first input terminal of the power amplifier.

6. The transmission circuit according to claim 1, wherein the transmission circuit further comprises:
   a third delay adjustment circuit for delaying switching of an operation of the first variable gain amplifier a third delay time; and
   a fourth delay adjustment circuit for delaying switching of an operation of the second variable gain amplifier a fourth delay time, wherein
   the control section adjusts the third delay time and the fourth delay time so that one of the output signal from the first variable gain amplifier and the output signal from the second variable gain amplifier is surely inputted to the second input terminal of the power amplifier.

7. The transmission circuit according to claim 2, wherein the transmission circuit further comprises:
   a fifth delay adjustment circuit for delaying switching of an operation of the first bias circuit a fifth delay time; and
   a sixth delay adjustment circuit for delaying switching an operation of the second bias circuit a sixth delay time, wherein
   the control section adjusts the fifth delay time and the sixth delay time so that one of the first bias control signal and the second bias control signal is surely inputted to the third input terminal of the power amplifier.

8. The transmission circuit according to claim 2, wherein the control section comprises:
- a signal generation section for generating the vector signal when the operation mode of the transmission circuit is the quadrature modulation scheme, and generating the amplitude signal and the phase signal when the operation mode of the transmission circuit is the polar modulation scheme;
- a bias control section for controlling the operation mode of the transmission circuit so that, when switching the operation mode of the transmission circuit, at least one of the following conditions is satisfied:
    - at least one of the direct-current voltage and the voltage in accordance with the amplitude signal is surely supplied to the first input terminal of the power amplifier;
    - at least one of the output signal from the first variable gain amplifier and the output signal from the second variable gain amplifier is surely inputted to the second input terminal of the power amplifier; and
    - at least one of the first bias control signal and the second bias control signal is surely inputted to the third input terminal of the power amplifier;
- a mode switching determination section for determining whether to switch the operation mode to the quadrature modulation scheme or the polar modulation scheme, based on the power information; and
- a mode switching control section for controlling the signal generation section and the bias control section, in accordance with determination by the mode switching determination section.

9. The transmission circuit according to claim 8, wherein the mode switching determination section determines whether to switch the operation mode of the transmission circuit to the quadrature modulation scheme or the polar modulation scheme, based on the power information and a lookup table defining the operation mode.

10. The transmission circuit according to claim 8, wherein the mode switching determination section determines that the transmission circuit is to be caused to operate in the quadrature modulation scheme if the power information is smaller than a predetermined threshold value, and determines that the transmission circuit is to be caused to operate in the polar modulation scheme if the power information is equal to or greater than the predetermined threshold value.

11. The transmission circuit according to claim 1, wherein the transmission circuit further comprises:
- a distributer for distributing the transmission signal outputted from the power amplifier; and
- a detector for detecting an output power of the distributer and outputting a voltage value in proportion to the output power when switching the operation mode of the transmission circuit, wherein
the control section further comprises:
- a comparison section for comparing a voltage value detected by the detector before the operation mode of the transmission circuit is switched and a voltage value detected by the detector after the operation mode of the transmission circuit is switched, and outputting a difference therebetween; and
- a gain control section for controlling at least one of the first gain and the second gain, based on the difference outputted by the comparison section and the power information so that an output power of the power amplifier converges to a target output power level.

12. The transmission circuit according to claim 2, wherein the transmission circuit further comprises:
- a distributer for distributing the transmission signal outputted from the power amplifier; and
- a detector for detecting an output power of the distributer and outputting a voltage value in proportion to the output power when switching the operation mode of the transmission circuit, wherein
the control section further comprises:
- a comparison section for comparing a voltage value detected by the detector before the operation mode of the transmission circuit is switched and a voltage value detected by the detector after the operation mode of the transmission circuit is switched, and outputting a difference therebetween; and
- a gain control section for controlling at least one of the first gain, the second gain, and the third gain, based on the difference outputted by the comparison section and the power information so that an output power of the power amplifier converges to a target output power level.

13. The transmission circuit according to claim 11, wherein, when the operation mode of the transmission circuit is switched, the control section converges the output power of the power amplifier to the target output power level within predetermined time periods before and after a boundary between symbols.

14. The transmission circuit according to claim 1, wherein the transmission circuit further comprises:
- a first DC power generation section for supplying the direct-current voltage to the first input terminal of the power amplifier when the operation mode of the transmission circuit is the quadrature modulation scheme; and
- a second DC power generation section for supplying a direct-current voltage that drives the regulator when the operation mode of the transmission circuit is the polar modulation scheme.

15. The transmission circuit according to claim 1, wherein the transmission circuit further comprises:
- a third DC power generation section for supplying a direct-current voltage that drives the first variable gain amplifier when the operation mode of the transmission circuit is the quadrature modulation scheme, and
- a fourth DC power generation section for supplying a direct-current voltage that drives the second variable gain amplifier when the operation mode of the transmission circuit is the polar modulation scheme.

16. The transmission circuit according to claim 2, wherein the transmission circuit further comprises:
- a fifth DC power supply generation section for supplying a direct-current voltage that drives the first bias circuit when the operation mode of the transmission circuit is the quadrature modulation scheme, and
- a sixth DC power supply generation section for supplying a direct-current voltage that drives the second bias circuit when the operation mode of the transmission circuit is the polar modulation scheme.

17. The transmission circuit according to claim 1, wherein the transmission circuit further comprises:
- a first DAC connected to digital-to-analog convert the I signal outputted by the control section to output a resultant signal to the amplitude phase modulation section when switching the operation mode of the transmission circuit from the polar modulation scheme to the quadrature modulation scheme, and connected to digital-to-analog convert the amplitude signal outputted by the control section to output a resultant signal to the regulator when switching the operation mode of the transmission circuit from the quadrature modulation scheme to the polar modulation scheme;

a second DAC connected to digital-to-analog convert the Q signal outputted by the control section to output a resultant data to the amplitude phase modulation section when switching the operation mode of the transmission circuit from the polar modulation scheme to the quadrature modulation scheme, and connected to digital-to-analog convert the phase signal outputted by the control section to output a resultant signal to the phase modulation section when switching the operation mode of the transmission circuit from the quadrature modulation scheme to the polar modulation scheme; and a DC power supply generation section for supplying a direct-current voltage to the regulator when switching the operation mode of the transmission circuit from the polar modulation scheme to the quadrature modulation scheme, so that the first input terminal of the power amplifier is prevented from being in the no input state, and supplying a direct-current voltage to the amplitude phase modulation section when switching the operation mode of the transmission circuit from the quadrature modulation scheme to the polar modulation scheme, so that the second input terminal of the power amplifier is prevented from being in the no input state.

18. The transmission circuit according to claim 5, wherein for switching the operation mode of the transmission circuit from the quadrature modulation scheme to the polar modulation scheme, given that the first delay time is $t_1$ and the second delay time is $t_2$, the first delay time $t_1$ and the second delay time $t_2$ are set so as to satisfy a relationship of a following equation:

$$t_1 + \min(d_1) > t_2 + \max(d_2),$$

where min ($d_1$) denotes a minimal value of a delay time $d_1$ which occurs in a path from the control section to the first input terminal of the power amplifier, exclusive of the first delay time $t_1$, and max ($d_2$) denotes a maximal value of a delay time $d_2$ which occurs in a path from the control section to the first input terminal of the power amplifier via the regulator, exclusive of the second delay time $t_2$.

19. The transmission circuit according to claim 5, wherein for switching the operation mode of the transmission circuit from the polar modulation scheme to the quadrature modulation scheme, the first delay time $t_1$ and the second delay time $t_2$ are set so as to satisfy a relationship of a following equation:

$$t_1 + \max(d_1) < t_2 + \min(d_2),$$

where max ($d_1$) denotes a maximal value of a delay time $d_1$ which occurs in a path from the control section to the first input terminal of the power amplifier, exclusive of the first delay time $t_1$, and min ($d_2$) denotes a minimal value of a delay time $d_2$ which occurs in a path from the control section to the first input terminal of the power amplifier via the regulator, exclusive of the second delay time $t_2$.

20. The transmission circuit according to claim 6, wherein for switching the operation mode of the transmission circuit from the quadrature modulation scheme to the polar modulation scheme, given that the third delay time is $t_3$ and the fourth delay time is $t_4$, the third delay time $t_3$ and the fourth delay time $t_4$ are set so as to satisfy a relationship of a following equation:

$$t_3 + \min(d_3) > t_4 + \max(d_4),$$

where min ($d_3$) denotes a minimal value of a delay time $d_3$ which occurs in a path from the control section to the second input terminal via the amplitude phase modulation section and the first variable gain amplifier, exclusive of the third delay time $t_3$, and max ($d_4$) denotes a maximal value of delay time $d_4$ which occurs in a path from the control section to the second input terminal via the phase modulation section and the second variable gain amplifier, exclusive of the third delay time $t_3$.

21. The transmission circuit according to claim 6, wherein for switching the operation mode of the transmission circuit from the polar modulation scheme to the quadrature modulation scheme, the third delay time $t_3$ and the fourth delay time $t_4$ are set so as to satisfy a relationship of a following equation:

$$t_3 + \max(d_3) < t_4 + \min(d_4),$$

where max ($d_3$) denotes a maximal value of a delay time $d_3$ which occurs in a path from the control section to the second input terminal via the amplitude phase modulation section and the first variable gain amplifier, exclusive of the third delay time $t_3$, and min ($d_4$) denotes a minimal value of the delay time $d_4$ which occurs in a path from the control section to the second input terminal via the phase modulation section and the second variable gain amplifier, exclusive of the fourth delay time $t_4$.

22. The transmission circuit according to claim 7, wherein for switching the operation mode of the transmission circuit from the quadrature modulation scheme to the polar modulation scheme, given that the fifth delay time is $t_5$ and the sixth delay time is $t_6$, the fifth delay time $t_5$ and the sixth delay time $t_6$ are set so as to satisfy a relationship of a following equation:

$$t_5 + \min(d_5) > t_6 + \max(d_6),$$

where min ($d_5$) denotes a minimal value of a delay time $d_5$ which occurs in a path from the control section to the third input terminal via the first bias circuit, exclusive of the fifth delay time $t_5$, and max ($d_6$) denotes a maximal value of a delay time $d_6$ which occurs in a path from the control section to the third input terminal via the second bias circuit, exclusive of the sixth delay time $t_6$.

23. The transmission circuit according to claim 7, wherein for switching the operation mode of the transmission circuit from the polar modulation scheme to the quadrature modulation scheme, the fifth delay time $t_5$ and the sixth delay time $t_6$ are set so as to satisfy a relationship of a following equation:

$$t_5 + \max(d_5) < t_6 + \min(d_6),$$

where max ($d_5$) denotes a maximal value of a delay time $d_5$ which occurs in a path from the control section to the third input terminal via the first bias circuit, exclusive of the fifth delay time $t_5$, and min ($d_6$) denotes a minimal value of a delay time $d_6$ which occurs in a path from the control section to the third input terminal via the second bias circuit, exclusive of the sixth delay time $t_6$.

24. A transmission circuit for outputting a transmission signal, comprising:

a control section for switching between a first operation mode and a second operation mode, based on power information; and a power amplifier for amplifying a signal inputted from a second input terminal, based on a signal inputted from a first input terminal, wherein at least one of the signal inputted to the first input terminal of the power amplifier and the signal inputted to the second input terminal of the power amplifier is switched in accordance with an operation mode of the transmission circuit, and the control section controls switching of the operation mode of the transmission circuit so that at least one of the first input terminal or the second input terminal is prevented from being in a no input state.

25. A communication device comprising:

a transmission circuit for generating a transmission signal; and an antenna for outputting the transmission signal generated by the transmission circuit, wherein the transmission circuit is the transmission circuit according to claim 1.

26. The transmission circuit according to claim 25, further comprising:

a reception circuit for processing a reception signal received from the antenna; and an antenna duplexer for outputting the transmission signal generated by the transmission circuit to the antenna and outputting the reception signal received from the antenna to the reception circuit.

* * * * *